(12) United States Patent
Jin et al.

(10) Patent No.: US 12,336,423 B2
(45) Date of Patent: Jun. 17, 2025

(54) ACTIVE LAYER COMPOSITION FOR SOLAR CELL, PREPARATION METHOD THEREOF AND ORGANIC SOLAR CELL COMPRISING THE SAME

(71) Applicant: PUSAN NATIONAL UNIVERSITY INDUSTRY-UNIVERSITY COOPERRATION FOUNDATION, Busan (KR)

(72) Inventors: Sung Ho Jin, Busan (KR); Jin Hwan Yoon, Busan (KR); Ho Yeol Park, Busan (KR)

(73) Assignee: PUSAN NATIONAL UNIVERSITY INDUSTRY-UNIVERSITY COOPERATION FOUNDATION, Busan (KR)

( * ) Notice: Subject to any disclaimer, the term of this patent is extended or adjusted under 35 U.S.C. 154(b) by 30 days.

(21) Appl. No.: 17/007,610

(22) Filed: Aug. 31, 2020

(65) Prior Publication Data

US 2021/0359228 A1 Nov. 18, 2021

(30) Foreign Application Priority Data

May 15, 2020 (KR) .......................... 10-2020-0058172

(51) Int. Cl.
*H01L 31/00* (2006.01)
*C07F 7/08* (2006.01)
(Continued)

(52) U.S. Cl.
CPC ........... *H10K 85/40* (2023.02); *C07F 7/0838* (2013.01); *C07F 7/0889* (2013.01);
(Continued)

(58) Field of Classification Search
CPC .... H10K 85/40; H10K 85/113; H10K 85/151; H10K 85/655; H10K 85/6576;
(Continued)

(56) References Cited

U.S. PATENT DOCUMENTS

2010/0276643 A1* 11/2010 Uetani ................. H10K 85/215
977/734

FOREIGN PATENT DOCUMENTS

| CN | 107298758 | * | 6/2019 | ........... H10K 85/151 |
| WO | WO 2019/137329 | * | 7/2019 | ............. H01L 51/36 |

OTHER PUBLICATIONS

Zhang et al., "Over 15% Efficiency in Polymer Solar Cells Enabled by a Chlorinated Polymer Donor", Adv. Mater. 2018, 30, 1800868, pp. 1-7. (Year: 2018).*

(Continued)

*Primary Examiner* — Thanh Truc Trinh
(74) *Attorney, Agent, or Firm* — NORTON ROSE FULBRIGHT US LLP

(57) ABSTRACT

Disclosed are an active layer composition for a solar cell containing a two-dimensional conjugated polymer that has excellent thermal/chemical stability and may improve power conversion efficiency of an organic solar cell via realization of high open-circuit voltage and short-circuit current, a preparation method of the composition, and an organic solar cell containing the composition. The composition contains a two-dimensional conjugated polymer having a repeating unit represented by a following Chemical Formula 4-2 as an electron donor material:

(Continued)

[Chemical Formula 4-2]

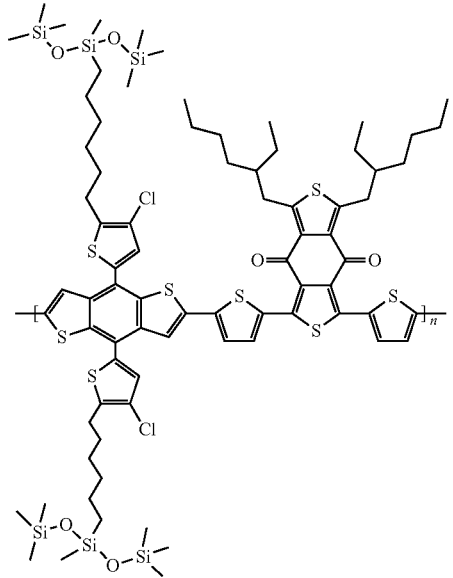

wherein the Chemical Formula 4-2, n is an integer of 5 to 2000.

8 Claims, 14 Drawing Sheets

(51) Int. Cl.
    *C08G 61/12* (2006.01)
    *H10K 85/20* (2023.01)
    *H10K 85/40* (2023.01)
    *H10K 30/30* (2023.01)
    *H10K 85/10* (2023.01)
    *H10K 85/60* (2023.01)

(52) U.S. Cl.
    CPC ......... *C08G 61/126* (2013.01); *H10K 85/211* (2023.02); *C08G 2261/124* (2013.01); *C08G 2261/1412* (2013.01); *C08G 2261/147* (2013.01); *C08G 2261/149* (2013.01); *C08G 2261/18* (2013.01); *C08G 2261/226* (2013.01); *C08G 2261/228* (2013.01); *C08G 2261/3223* (2013.01); *C08G 2261/3243* (2013.01); *C08G 2261/91* (2013.01); *H10K 30/30* (2023.02); *H10K 85/113* (2023.02); *H10K 85/151* (2023.02); *H10K 85/655* (2023.02); *H10K 85/6576* (2023.02)

(58) Field of Classification Search
CPC ...... H10K 85/657; H10K 30/30; H10K 30/50; C07F 7/0838; C07F 7/0889; C08G 61/126; C08G 2261/124; C08G 2261/1412; C08G 2261/147; C08G 2261/149; C08G 2261/18; C08G 2261/226; C08G 2261/228; C08G 2261/3223; C08G 2261/3243; C08G 2261/91; C08G 2261/144; C08G 2261/146; C08G 2261/148; C08G 2261/344; C08G 2261/414; Y02E 10/549
See application file for complete search history.

(56) References Cited

OTHER PUBLICATIONS

Doumon et al., "Photostability of Fullerene and Non-Fullerene Polymer Solar Cells: The Role of the Acceptor", ACS Appl. Mater. Interfaces 2019, 11, 8310-8318. (Year: 2019).*
Wang et al., "Introduction of Siloxane-Terminated Side Chains into Semiconducting Polymers To Tune Phase Separation with Nonfullerene Acceptor for Polymer Solar Cells", ACS Appl. Mater. Interfaces 2020, 12, 4659-4672. (Year: 2020).*
Qin et al., "A polymer design strategy toward green solvent processed efficient non-fullerene polymer solar cells", J. Mater. Chem. A, 2018, 6, 4324-4330. (Year: 2018).*
Jiang et al., "Impact of the Siloxane-Terminated Side Chain on Photovoltaic Performances of the Dithienylbenzodithiophene-Difluorobenzotriazole-Based Wide Band Gap Polymer Donor in Non-Fullerene Polymer Solar Cells", ACS Appl. Mater. Interfaces 2019, 11, 29094-29104. (Year: 2019).*
Zhao et al., "Environmentally-friendly solvent processed fullerene-free organic solar cells enabled by screening halogen free solvent additives", Science China Materials, Aug. 7, 2017, pp. 1-12. (Year: 2017).*
Cui et al., "Over 16% efficiency organic photovoltaic cells enabled by a chlorinated acceptor with increased open-circuit voltages", Nature Communications, 2019, pp. 1-8. (Year: 2019).*
Machine translation of CN107298758, pp. 1-22 (Year: 2019).*
Do et al., "Significant of Siloxane Functionalized Side-Chain pi-Conjugated Polymer Donor: Optimization of Active Layer Morphology Toward the Stable All-Polymer Solar Cells", Macromol. Res., 30(3), 183-189. (Year: 2022).*
Gokulnath et al., "A wide bandgap pi-conjugated polymer for high-performance ternary organic solar cells with an efficiency of 17.40%", Nano Energy 89 (2021) 106323, pp. 1-10. (Year: 2021).*

* cited by examiner

[FIG. 1]
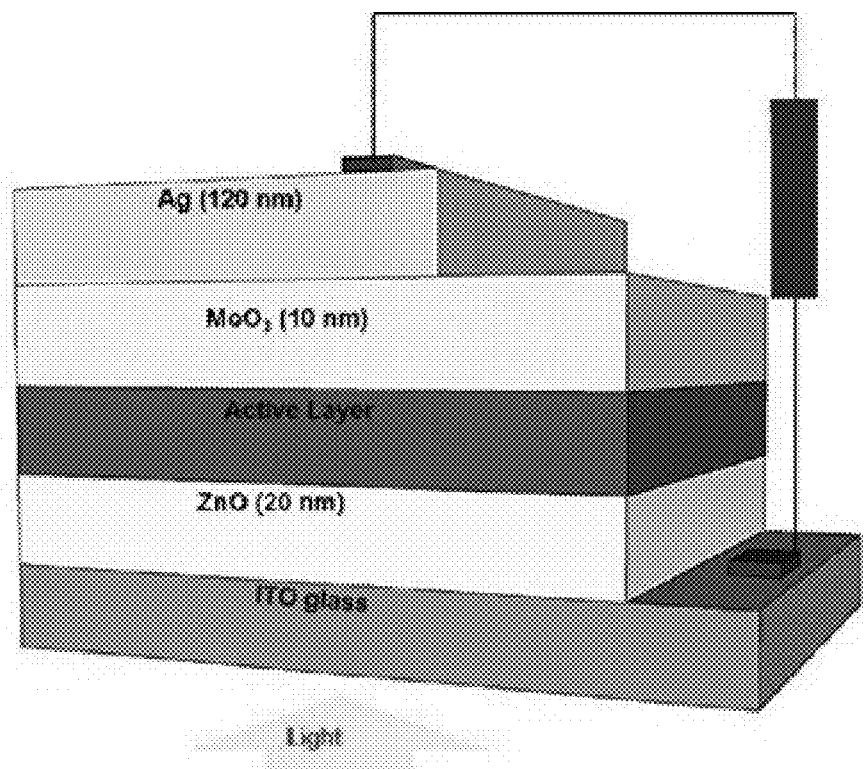

[FIG. 2A]
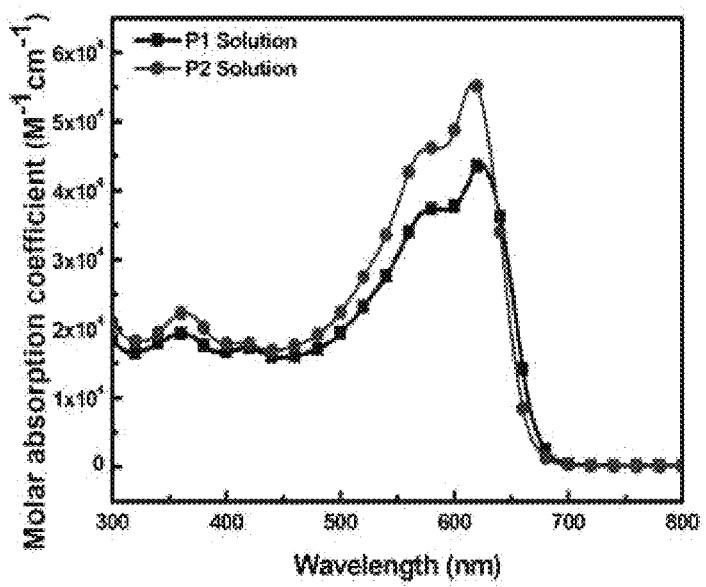
[FIG. 2B]
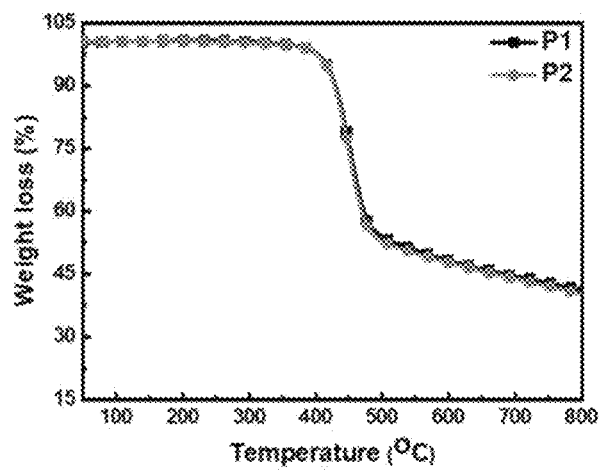

[FIG. 2C]
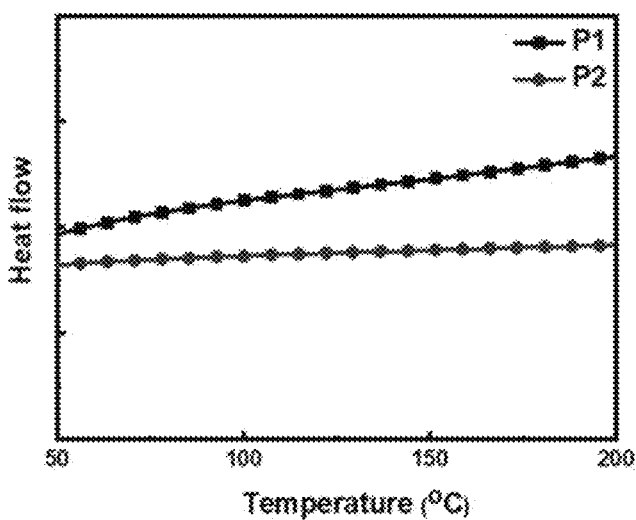
[FIG. 2D]
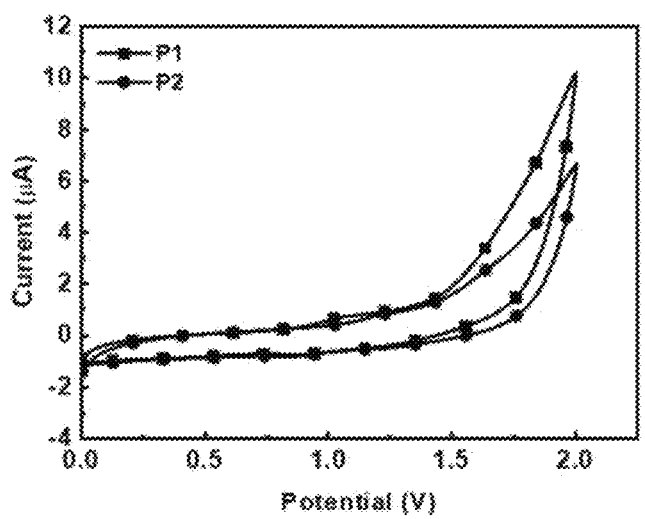

[FIG. 2E]
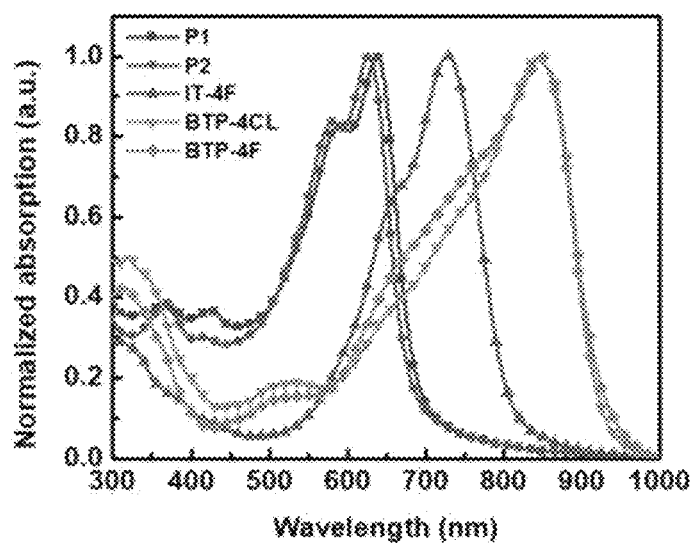
[FIG. 2F]
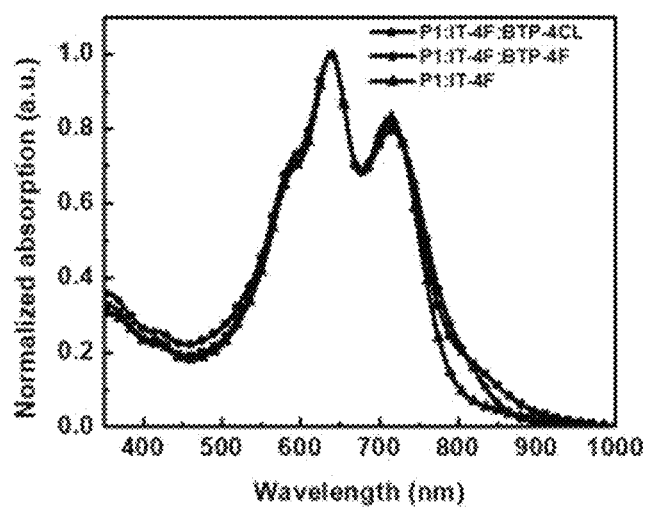

[FIG. 2G]
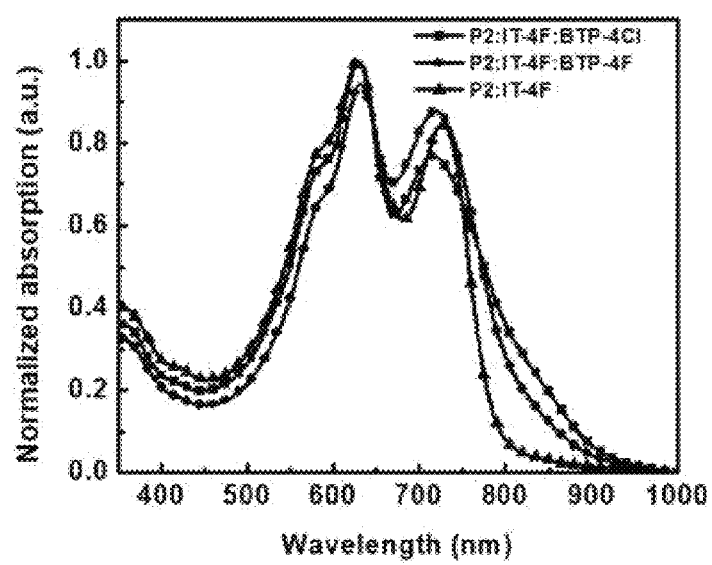
[FIG. 2H]
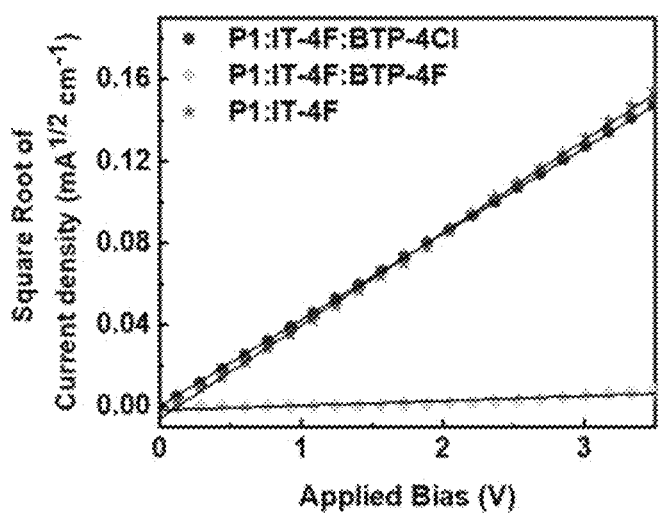

[FIG. 2I]
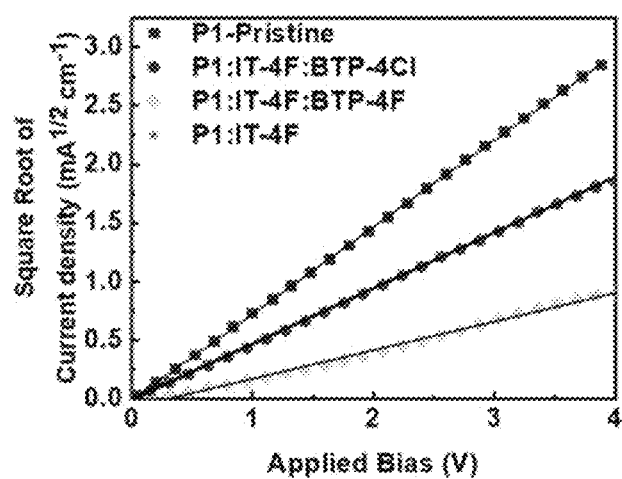
[FIG. 2J]
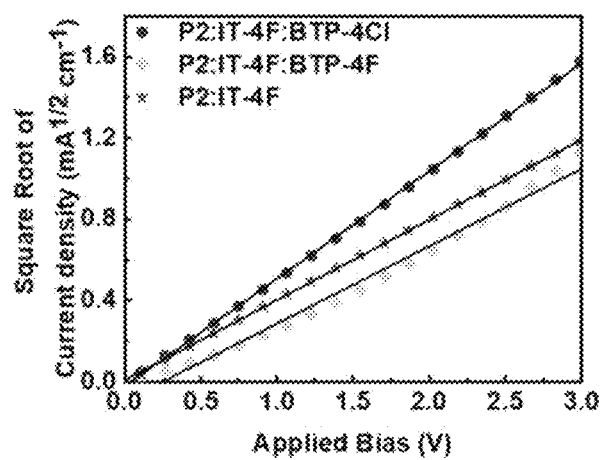

[FIG. 2K]
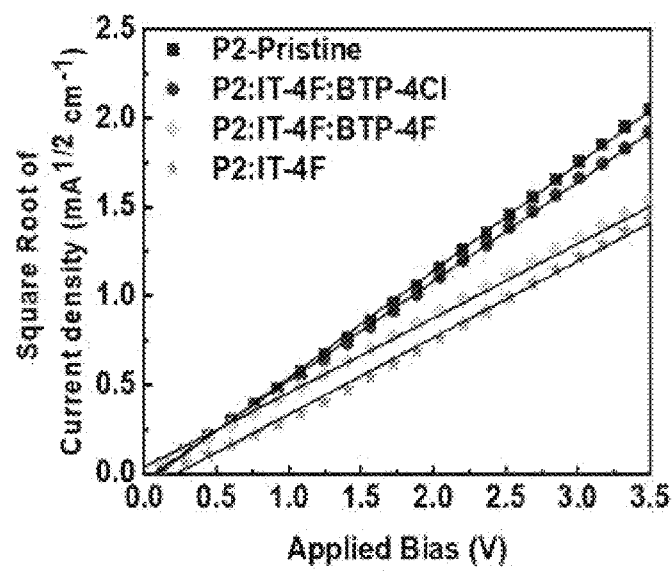
[FIG. 2L]
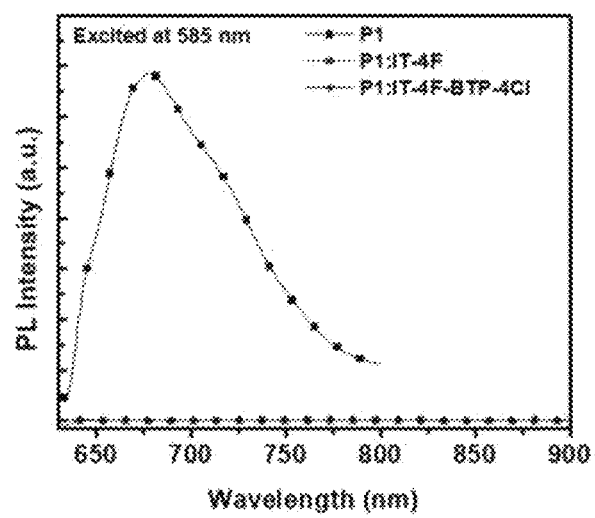

[FIG. 2M]
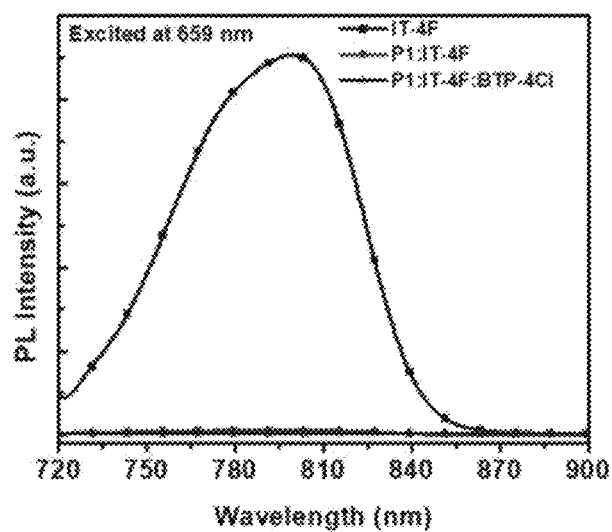
[FIG. 2N]
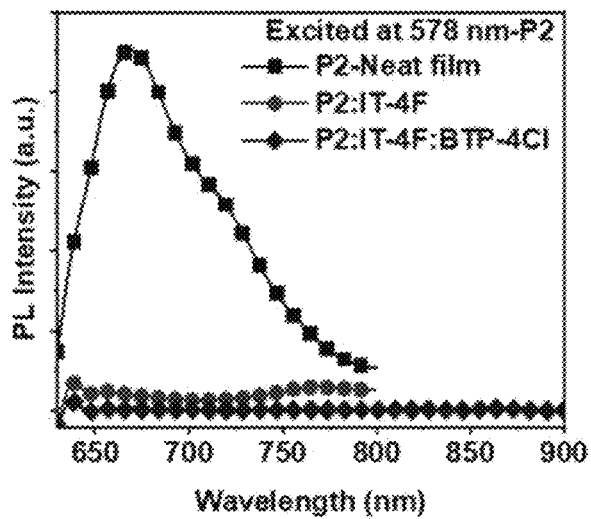

【FIG. 2O】
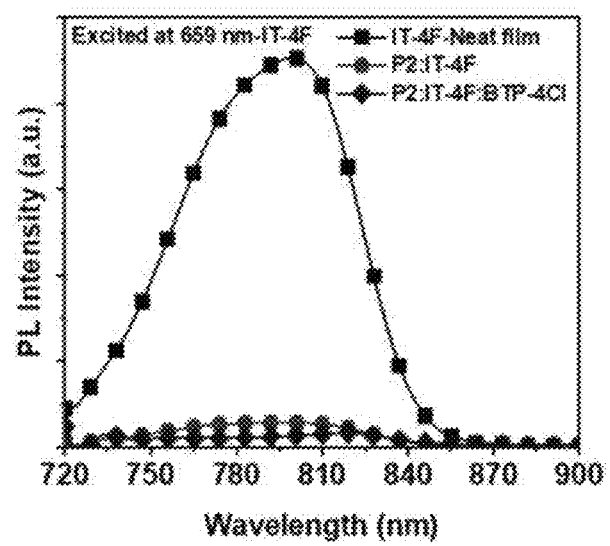
【FIG. 3】
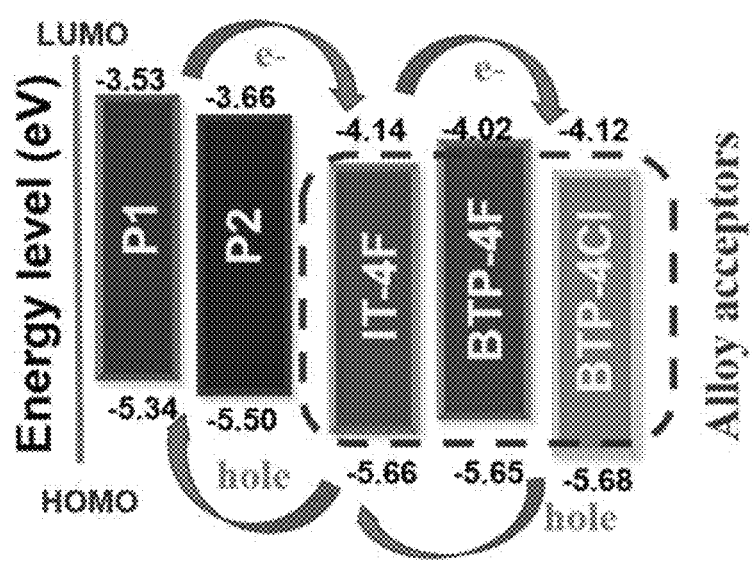

[FIG. 4A]
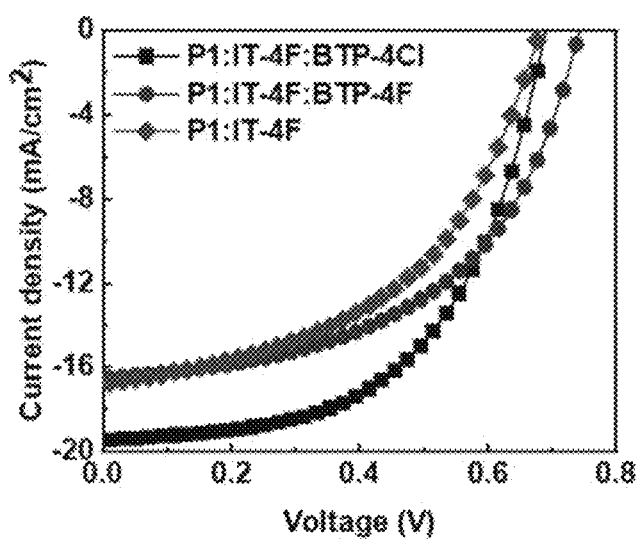
[FIG. 4B]
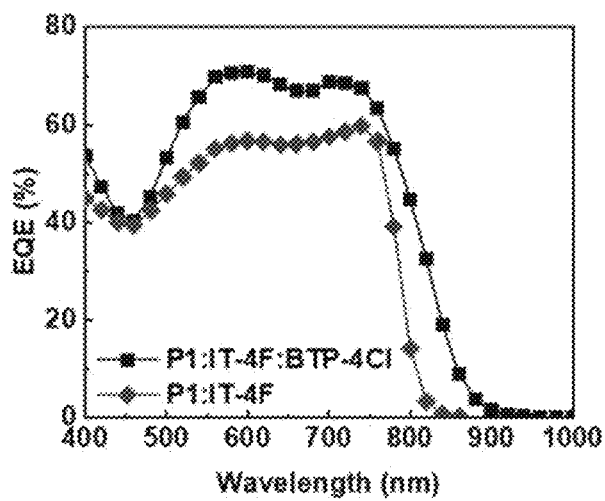

[FIG. 5A]
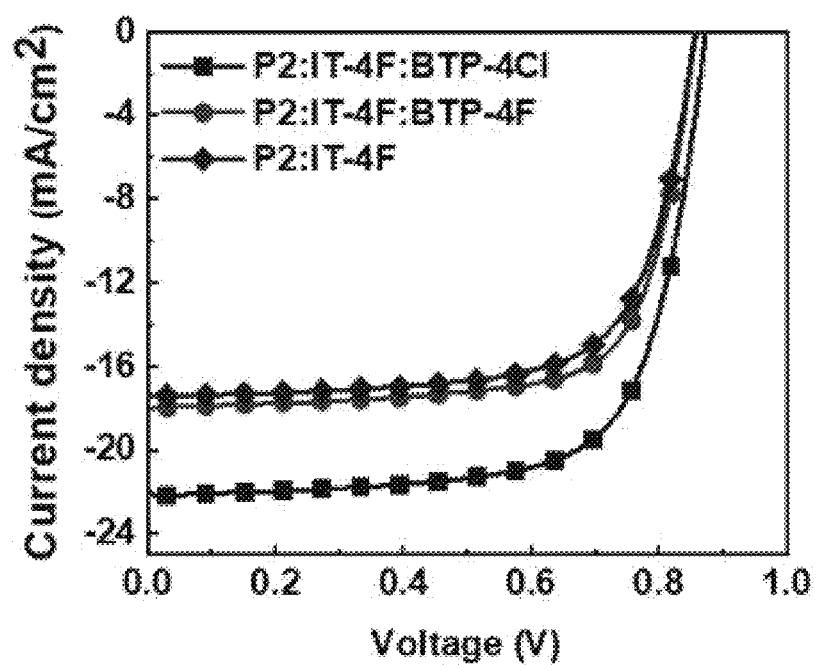

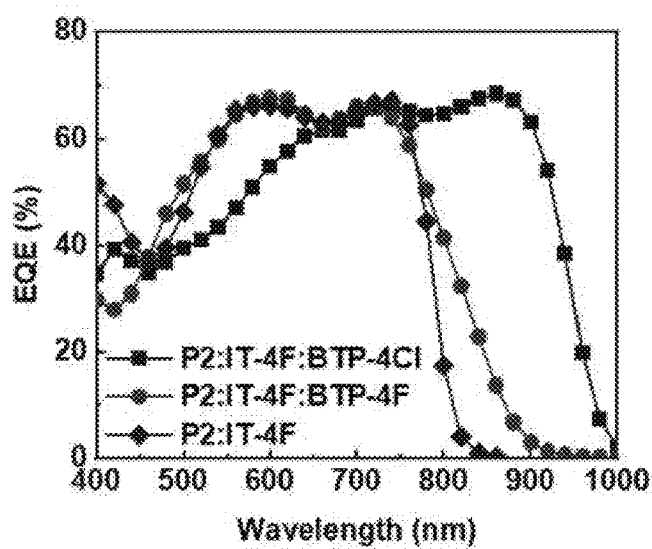
[FIG. 5B]
[FIG. 6]
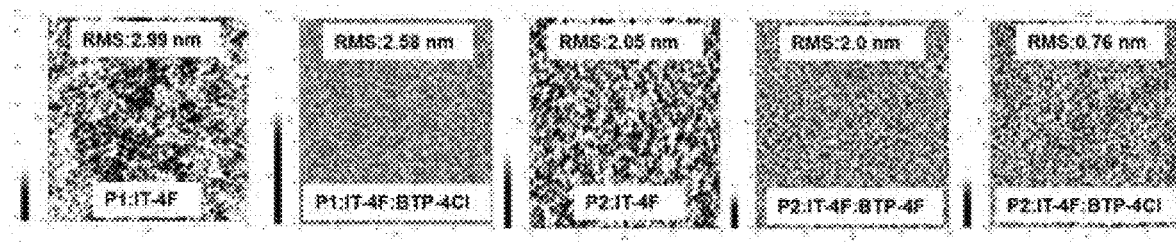

[FIG. 7A]
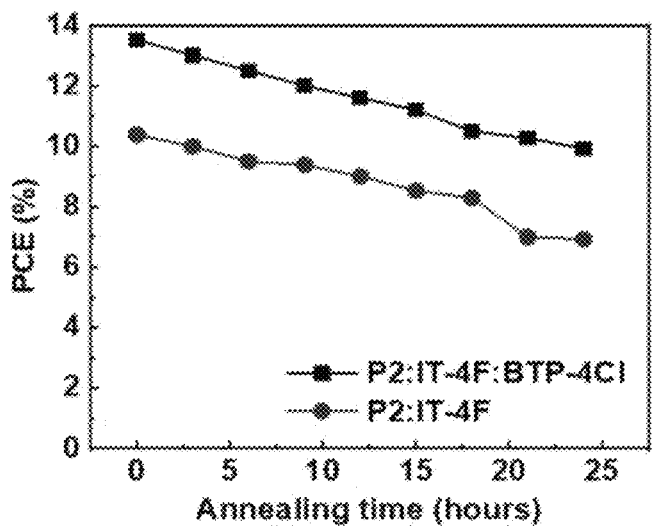
[FIG. 7B]
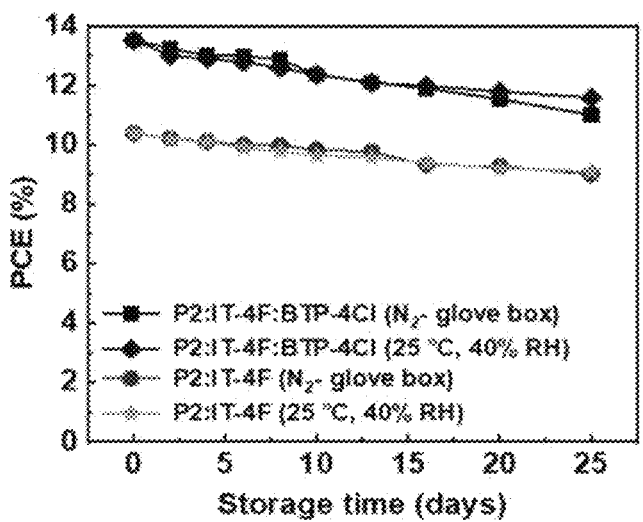

[FIG. 8]
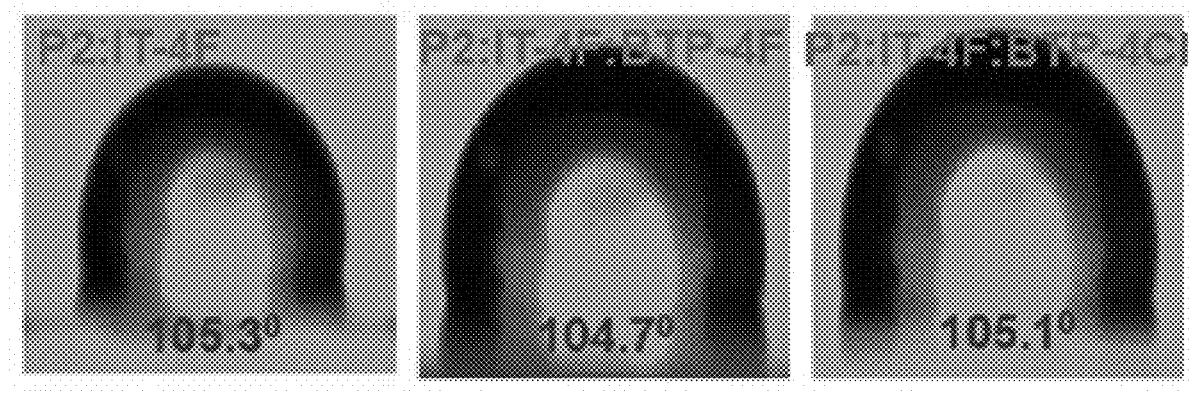

ACTIVE LAYER COMPOSITION FOR SOLAR CELL, PREPARATION METHOD THEREOF AND ORGANIC SOLAR CELL COMPRISING THE SAME

CROSS-REFERENCE TO RELATED APPLICATION

This application claims a benefit under 35 U.S.C. § 119(a) of Korean Patent Application No. 10-2020-0058172 filed on May 15, 2020, on the Korean Intellectual Property Office, the entire disclosure of which is incorporated herein by reference for all purposes.

BACKGROUND

1. Field

The present disclosure relates to an active layer composition for a solar cell containing a two-dimensional conjugated polymer that has excellent thermal/chemical stability and may improve power conversion efficiency of an organic solar cell via realization of high open-circuit voltage and short-circuit current, and relates to a preparation method of the composition and an organic solar cell containing the composition.

2. Description of Related Art

An organic solar cell (OSC) is formed in two forms: a polymer-fullerene derivative based solar cell and a polymer-non-fullerene derivative based solar cell. A conventional fullerene-based solar cell has a high power conversion efficiency of about 11%, but has a disadvantage in that a synthesis cost thereof is high and it is difficult to control a chemical structure thereof and thus an energy level thereof and thus to obtain a high voltage value.

In addition, the conventional fullerene-based solar cell has weak light absorption properties, low viscosity compared to a polymer. Further, it is difficult to separate and purify an isomer generated during synthesis thereof. Therefore, a solar cell using a non-fullerene-based electron acceptor (NFA) as a solution to the above-described problem is receiving great attention.

The non-fullerene-based organic solar cell in which a photo-active layer composed of a mixture of two components, that is, a donor polymer with a π-conjugated structure and a low-molecular NFA is introduced using a solution process has excellent properties such as improved light absorption, variable chemical structure, and thus variable energy levels. In terms of efficiency, the non-fullerene-based organic solar cell may exhibit higher efficiency compared to the fullerene-based organic solar cell.

Further, the non-fullerene-based organic solar cell has improved stability against thermal and mechanical stress compared to the fullerene-based organic solar cell. This improved stability is an important factor in developing a flexible and portable polymer solar cell.

Therefore, in recent years, interest in development of the non-fullerene-based solar cell is increasing. In addition, development of a donor polymer having a π-conjugated structure having suitable light absorption and energy level and mixed with a non-fullerene-based material is drawing further attention.

A very high-efficiency device having a molecular bulk-heterojunction (BHJ) structure using the low molecular weight NFA and the π-conjugated donor polymer has been developed. Recently, energy conversion efficiency of 13% has been achieved by a single junction using the low molecular weight NFA. Energy conversion efficiency of 16% was achieved using binary and ternary junctions. Further, it has been reported that NFOSCs using a tandem structure and a ternary junction achieve 17% energy conversion efficiency.

However, all of the above mentioned high efficiency NFOSCs are the results of studies obtained using a halogen solvents such as chloroform or chlorobenzene. However, it is difficult to commercialize using the halogen solvents due to environmental regulations.

In this connection, when a non-halogen solvent is used, there is a problem in that the energy conversion efficiency of the solar cell is rapidly deteriorated.

A photo-active layer of the conventional organic solar cell has a thickness of about 100 nm and is very thin, thereby to makes it difficult to apply the photo-active layer to a large area printing process. However, there is a problem in that efficiency of the solar cell is lowered when the photo-active layer has a thickness of 300 nm and thus is thick.

Therefore, it is necessary to develop a solar cell photo-active layer capable of maintaining energy conversion efficiency even when an eco-friendly solvent is used or the thickness of the photo-active layer is large.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose according to the present disclosure is to provide an active layer composition for a solar cell containing a two-dimensional conjugated polymer that has excellent thermal/chemical stability and may improve power conversion efficiency of an organic solar cell via realization of high open-circuit voltage and short-circuit current, and is to provide a preparation method of the composition.

Another purpose according to the present disclosure is to provide an organic solar cell containing the active layer composition for the solar cell.

A first aspect of the present disclosure provides an active layer composition for a solar cell, the composition containing a two-dimensional conjugated polymer having a repeating unit represented by a following Chemical Formula 1 as an electron donor material;

[Chemical Formula 1]

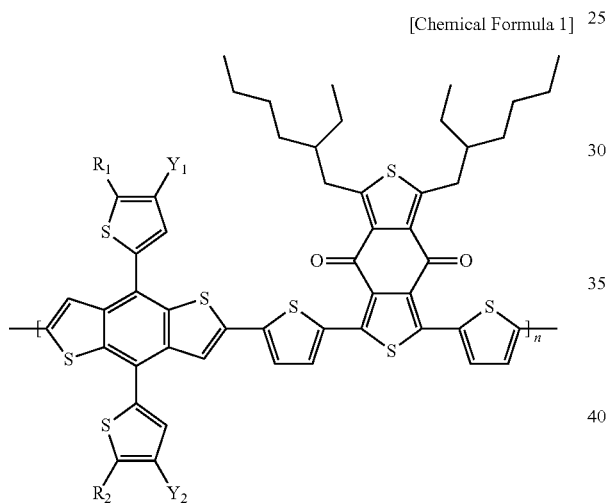

wherein in the Chemical Formula 1, each of $Y_1$ and $Y_2$ independently represents H, F or Cl, wherein each of $R_1$ and $R_2$ independently represents substituted or unsubstituted alkyl having 1 to 30 carbon atoms, cycloalkyl having 3 to 20 carbon atoms, alkylthio having 1 to 30 carbon atoms, halogen, aryl having 6 to 20 carbon atoms, aryl having 6 to 20 carbon atoms substituted with alkyl having 1 to 30 carbon atoms, alkyl having 1 to 30 carbon atoms substituted with aryl having 6 to 20 carbon atoms, or heteroaryl having 3 to 20 carbon atoms, wherein the heteroaryl contains at least one heteroatom selected from N, O, S and Se, wherein n is an integer of 5 to 2000.

In one implementation of the first aspect, the two-dimensional conjugated polymer contains a repeating unit represented by a following Chemical Formula 2:

[Chemical Formula 2]

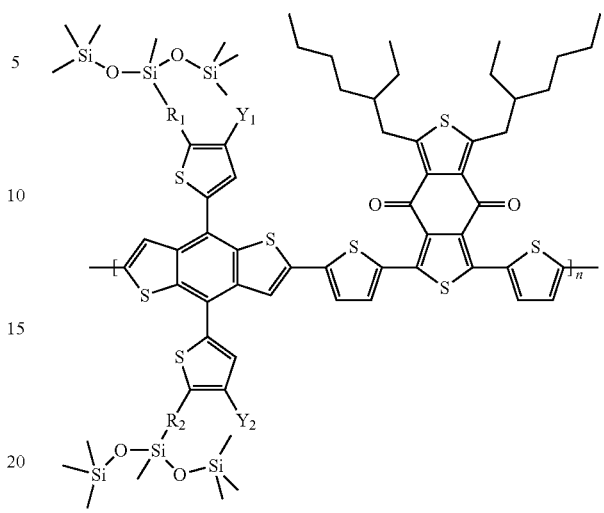

wherein in the Chemical Formula 2, each of $Y_1$ and $Y_2$ independently represents H, F or Cl, wherein each of $R_1$ and $R_2$ independently represents substituted or unsubstituted alkyl having 1 to 30 carbon atoms, cycloalkyl having 3 to 20 carbon atoms, alkylthio having 1 to 30 carbon atoms, halogen, aryl having 6 to 20 carbon atoms, aryl having 6 to 20 carbon atoms substituted with alkyl having 1 to 30 carbon atoms, alkyl having 1 to 30 carbon atoms substituted with aryl having 6 to 20 carbon atoms, or heteroaryl having 3 to 20 carbon atoms, wherein the heteroaryl contains at least one heteroatom selected from N, O, S and Se, wherein n is an integer of 5 to 2000.

The two-dimensional conjugated polymer having a structure of the Chemical Formula 1 or the Chemical Formula 2 may be easily synthesized and purified, and may have great solubility in an eco-friendly organic solvent such as a non-halogen solvent, and thus, may easily form an uniform and dense film without agglomeration, ands thus may be used for preparation of a large-area solar cell.

In addition, the two-dimensional conjugated polymer may have a controllable energy level, and has excellent compatibility with a non-fullerene-based electron acceptor material, and thus may be used as a donor material of the photo-active layer of the non-fullerene-based solar cell to improve the power conversion efficiency of the solar cell.

In one implementation of the first aspect, the two-dimensional conjugated polymer contains a repeating unit represented by a following Chemical Formula 3:

[Chemical Formula 3]

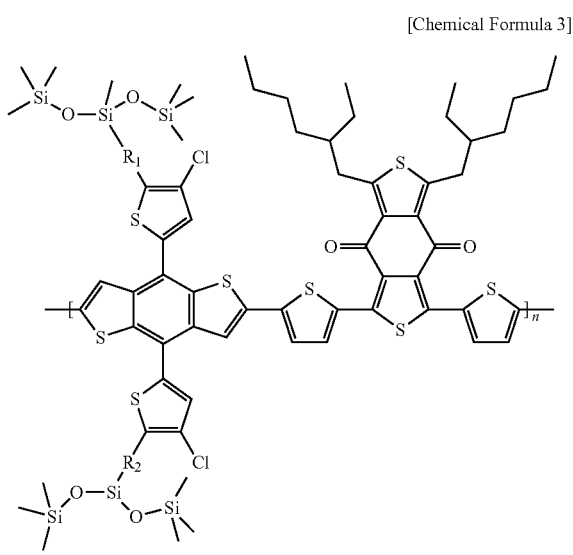

wherein in the Chemical Formula 3, each of $R_1$ and $R_2$ independently represents substituted or unsubstituted alkyl having 1 to 30 carbon atoms, cycloalkyl having 3 to 20 carbon atoms, alkylthio having 1 to 30 carbon atoms, halogen, aryl having 6 to 20 carbon atoms, aryl having 6 to 20 carbon atoms substituted with alkyl having 1 to 30 carbon atoms, alkyl having 1 to 30 carbon atoms substituted with aryl having 6 to 20 carbon atoms, or heteroaryl having 3 to 20 carbon atoms, wherein the heteroaryl contains at least one heteroatom selected from N, O, S and Se, wherein n is an integer of 5 to 2000.

As shown in the Chemical Formula 3, when each of $Y_1$ and $Y_2$ in the Chemical Formula 2 includes a chlorine atom (Cl), a HOMO energy level of the two-dimensional conjugated polymer may be lowered to increase an open-circuit voltage, thereby to improve the power conversion efficiency of the organic solar cell including the active layer containing the composition according to the present disclosure.

In one implementation of the first aspect, the two-dimensional conjugated polymer contains a repeating unit represented by a following Chemical Formula 4-1 or 4-2:

[Chemical Formula 4-1]

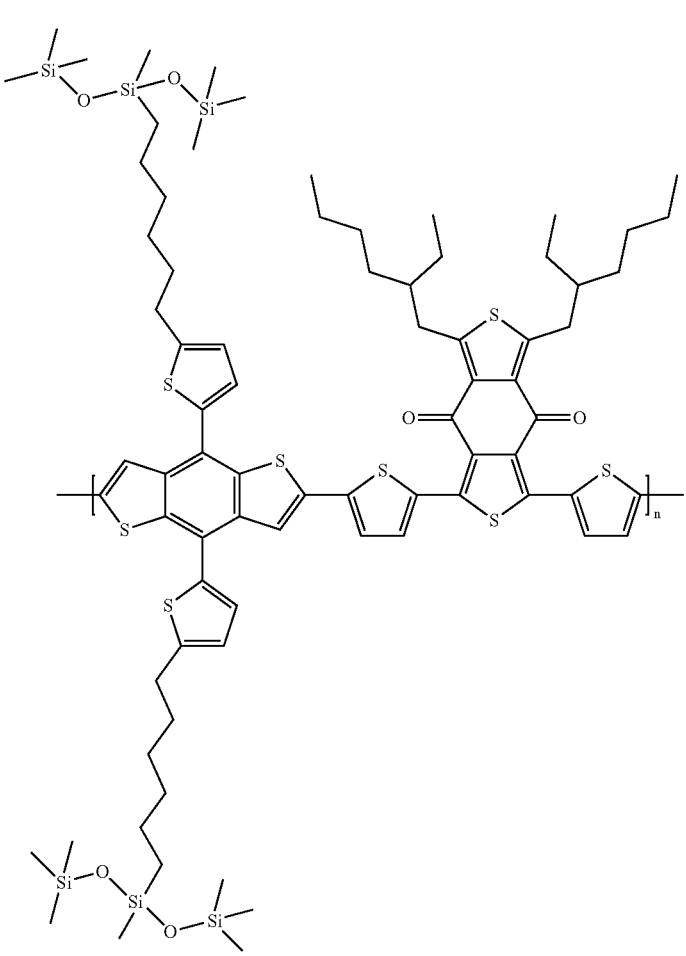

-continued

[Chemical Formula 4-2]

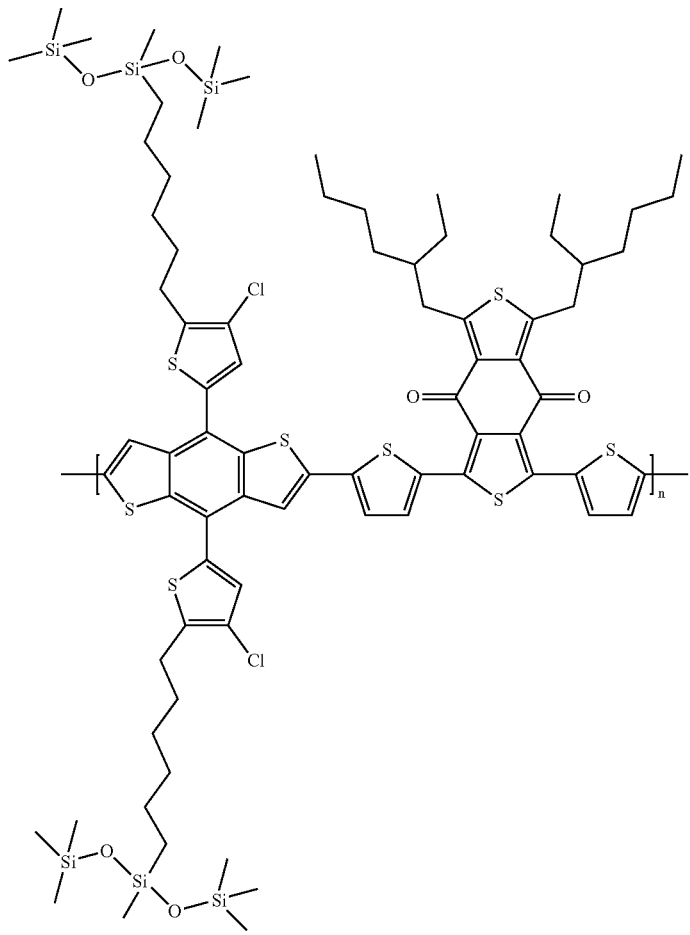

wherein in the Chemical Formula 4-1 and Chemical Formula 4-2, n is an integer of 5 to 2000.

In one implementation of the first aspect, a highest occupied molecule orbital (HOMO) energy level of the two-dimensional conjugated polymer is in a range of −5.6 to −5.3 eV, and a lowest un-occupied molecular orbital (LUMO) energy level thereof is in a range of −3.7 to −3.5 eV. In one implementation of the first aspect, a charge mobility of the two-dimensional conjugated polymer is in a range of $4.5 \times 10^{-2}$ to $5.7 \times 10^{-2}$ $cm^2 V^{-1} S^{-1}$. Thus, the polymer according to the present disclosure has high charge mobility and thus exhibits excellent electrical properties.

In one implementation of the first aspect, the active layer composition further contains 100 to 50000 parts by weight of an organic solvent, and 10 to 300 parts by weight of an electron acceptor material, based on 100 parts by weight of the two-dimensional conjugated polymer.

In one implementation of the first aspect, the organic solvent includes a non-halogen solvent. In one implementation of the first aspect, the non-halogen solvent includes at least one selected from a group consisting of tetrahydrofuran (THF), dimethylformamide (DMF), dimethyl acetamide (DMAC), dimethyl sulfoxide (DMSO), toluene and alcohol.

In one implementation of the first aspect, the electron acceptor material includes a non-fullerene-based material. In one implementation of the first aspect, the non-fullerene-based material includes at least one selected from a group consisting of IT-4F (3,9-bis(2-methylene-((3-(1,1-dicyanomethylene)-6,7-difluoro)-indanone))-5,5,11,11-tetrakis (4-hexylphenyl)-dithieno[2,3-d:2',3'-d']-s-indaceno[1,2-b:5,6-b']dithiophene), BTP-4F (2,2'-((2Z,2'Z)-((12,13-bis(2-ethylhexyl)-3,9-diundecyl-12,13-dihydro-[1,2,5]thiadiazolo [3,4-e]thieno[2'',3''':4',5']thieno[2',3':4,5]pyrrolo[3,2-g] thieno[2',3':4,5]thieno[3,2-b]indole-2,10-diyl)bis (methanylylidene))bis(5,6-difluoro-3-oxo-2,3-dihydro-1H-indene-2,1-diylidene))dimalononitrile) and BTP-4Cl (2,2'-((2Z,2'Z)-((12,13-bis(2-ethylhexyl)-3,9-diundecyl-12,13-dihydro-[1,2,5]thiadiazolol[3,4-e]thieno[2'',3''':4',5']thieno [2',3':4,5]pyrrolo[3,2-g]thieno[2',3':4,5]thieno[3,2-b]indole-2,10-diyl)bis(methanylylidene))bis(5,6-dichloro-3-oxo-2,3-dihydro-1H-indene-2,1-diylidene))dimalononitrile).

A second aspect of the present disclosure provides a method for preparing an active layer composition for a solar cell, the method comprising performing a polymerizing reaction between a compound represented by a following Chemical Formula 5 and a compound represented by a following Chemical Formula 6 with each other under presence of a palladium catalyst, thereby preparing the two-dimensional conjugated polymer recited above:

[Chemical Formula 5]

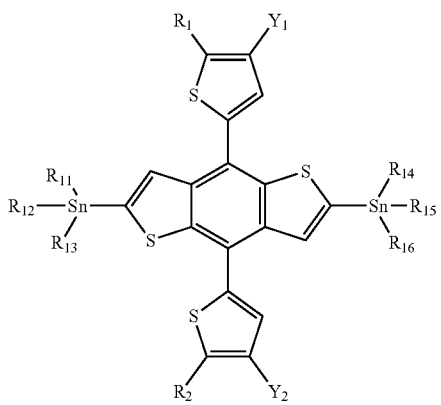

[Chemical Formula 6]

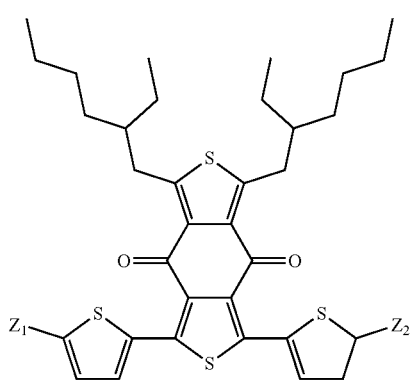

wherein in the Chemical Formula 5 and Chemical Formula 6, each of $Y_1$ and $Y_2$ independently represents H, F or Cl, wherein each of $R_1$ and $R_2$ independently represents substituted or unsubstituted alkyl having 1 to 30 carbon atoms, cycloalkyl having 3 to 20 carbon atoms, alkylthio having 1 to 30 carbon atoms, halogen, aryl having 6 to 20 carbon atoms, aryl having 6 to 20 carbon atoms substituted with alkyl having 1 to 30 carbon atoms, alkyl having 1 to 30 carbon atoms substituted with aryl having 6 to 20 carbon atoms, or heteroaryl having 3 to 20 carbon atoms, wherein the heteroaryl contains at least one heteroatom selected from N, O, S and Se, wherein each of $R_{11}$ and $R_{16}$ independently represents alkyl having 1 to 10 carbon atoms, wherein each of $Z_1$ and $Z_2$ independently represents F, Br or I, wherein n is an integer of 5 to 2000.

In one implementation of the second aspect, the polymerizing reaction is carried out at a temperature of 100 to 250° C. in an inert gas atmosphere under presence of an electron donating ligand.

In one implementation of the second aspect, the electron donating ligand includes at least one selected from a group consisting of tri(2furyl)phosphine ($P(furyl)_3$), tri(o-tolyl) phosphine ($P(o\text{-}tol)_3$), triphenylphosphine ($PPh_3$), tri-tert-butylphosphine ($P(t\text{-}bu)_3$) and copper iodide (CuI).

A third aspect of the present disclosure provides an organic solar cell comprising: a substrate; a first electrode disposed on the substrate; a photo-active layer disposed on the first electrode and containing the composition for the solar cell as defined above; and a second electrode disposed on the photo-active layer, wherein the photo-active layer has a bulk binary junction or a bulk ternary junction in which one type of an electron donor material and at least one type of a non-fullerene-based electron acceptor material are mixed with each other.

In one implementation of the third aspect, the organic solar cell further comprises: a hole transport layer disposed between the first electrode and the photo-active layer; and an electron transport layer disposed between the second electrode and the photo-active layer.

The photo-active layer contains the two-dimensional conjugated polymer according to the present disclosure as an electron donor material. Thus, the photo-active layer may improve the power conversion efficiency of the solar cell via realization of high open-circuit voltage and short-circuit current. Further, even in formation of a thick active layer, change in charge mobility is not large due to high charge mobility of the polymer, such that the photo-active layer may be applied to a large area process.

In one implementation of the third aspect, the photo-active layer has the bulk ternary junction structure in which one type of the electron donor material containing a repeating unit represented by a following Chemical Formula 4-2 is mixed with two types of the non-fullerene-based electron acceptor materials, wherein when a thickness of the photo-active layer is 450 nm or smaller, a power conversion efficiency (PCE) value (%) of the organic solar cell is 9.3% or greater, and a fill factor (FF) value (%) is 62.3% or greater, wherein when a thickness of the photo-active layer is 300 nm, a power conversion efficiency (PCE) value (%) of the organic solar cell is about 13%:

[Chemical Formula 4-2]

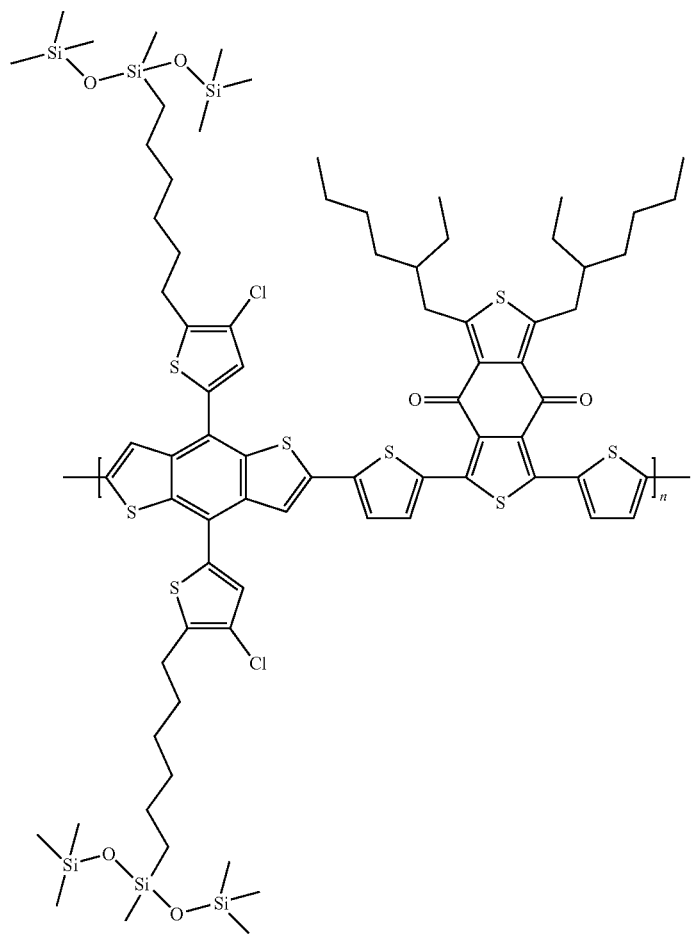

wherein in the Chemical Formula 4-2, n is an integer of 5 to 2000.

The active layer composition for the solar cell according to the present disclosure has excellent solubility in the environmentally friendly organic solvent, and thus has a dense and uniform thickness when used in a large area solar cell and module.

Further, the active layer composition for the solar cell according to the present disclosure contains the two-dimensional conjugated polymer having excellent thermal/chemical stability, and high electron mobility, thereby to exhibit excellent electrical properties even when the layer is thick.

Therefore, the organic solar cell having the composition according to the present disclosure as a material of the photo-active layer thereof has high short-circuit current (Jsc) due to high electron mobility, thereby improving the power conversion efficiency (PCE) and the open-circuit voltage (Voc).

In addition to the effects as described above, specific effects according to the present disclosure will be described together with the detailed description for carrying out the disclosure.

BRIEF DESCRIPTION OF DRAWINGS

FIG. 1 shows a structure of an organic solar cell according to an embodiment of the present disclosure.

FIG. 2A shows an UV spectrum of each of P1 and P2 prepared in Examples 1 and 2 respectively.

FIG. 2B shows a TGA measurement result of each of P1 and P2 prepared in Examples 1 and 2 respectively.

FIG. 2C shows a DSC measurement result of each of P1 and P2 prepared in Examples 1 and 2 respectively.

FIG. 2D shows a CV measurement result of each of P1 and P2 prepared in Examples 1 and 2 respectively.

FIG. 2E shows an UV spectrum of NFA according to an embodiment of the present disclosure.

FIG. 2F shows an UV spectrum of each of bulk-hetero binary- and ternary junctions using P1 prepared in Example 1 and NFA.

FIG. 2G shows an UV spectrum of each of bulk-hetero binary and ternary junctions using P2 as prepared in Example 2 and NFA.

FIG. 2H shows an electron mobility result of each of bulk-hetero binary and ternary junctions using P1 as prepared in Example 1 and NFA.

FIG. 2I shows a result of hole mobility of each of bulk-hetero binary and ternary junctions using P1 as prepared in Example 1 and NFA.

FIG. 2J shows a result of electron mobility of each of bulk-hetero binary and ternary junctions using P2 as prepared in Example 2, and NFA.

FIG. 2K shows a result of hole mobility of each of bulk-hetero binary and ternary junctions using P2 as prepared in Example 2 and NFA.

FIG. 2L and FIG. 2M show PL spectra of bulk-hetero binary and ternary junctions using P1 as prepared in Example 1 and NFA.

FIG. 2N and FIG. 2O show PL spectra of bulk-hetero binary and ternary junctions using P2 as prepared in Example 2 and NFA.

FIG. 3 shows an energy level diagram of each of P1 and P2 prepared in Examples 1 and 2 respectively and NFA.

FIG. 4A shows a J-V characteristic curve of a P1-containing organic solar cell.

FIG. 4B shows an EQE spectrum of the P1-containing organic solar cell.

FIG. 5A shows a J-V characteristic curve of a P2-containing organic solar cell.

FIG. 5B shows an EQE spectrum of the P2-containing organic solar cell.

FIG. 6 shows a result of surface roughness of each of bulk-hetero binary and ternary junctions using P1 and P2 as prepared in Examples 1 and 2 respectively and NFA.

FIG. 7A shows a result of evaluation of a lifespan of an organic solar cell as the P2-containing organic solar cell related to thermal stability.

FIG. 7B shows a result of evaluating a lifespan of an organic solar cell as the P2-containing organic solar cells under constant temperature and constant humidity and nitrogen atmosphere FIG. 8 shows a result of measuring a contact angle of a P2 containing photo-active layer.

DETAILED DESCRIPTIONS

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An active layer composition for a solar cell according to the present disclosure may contain a two-dimensional conjugated polymer having a repeating unit represented by a following Chemical Formula 1 as an electron donor material:

[Chemical Formula 1]

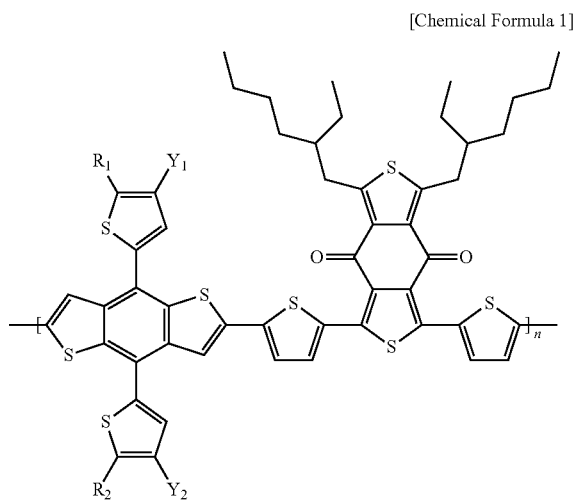

wherein in the Chemical Formula 1, each of $Y_1$ and $Y_2$ independently represents H, F or Cl, wherein each of $R_1$ and $R_2$ independently represents substituted or unsubstituted alkyl having 1 to 30 carbon atoms, cycloalkyl having 3 to 20 carbon atoms, alkylthio having 1 to 30 carbon atoms, halogen, aryl having 6 to 20 carbon atoms, aryl having 6 to 20 carbon atoms substituted with alkyl having 1 to 30 carbon atoms, alkyl having 1 to 30 carbon atoms substituted with aryl having 6 to 20 carbon atoms, or heteroaryl having 3 to 20 carbon atoms, wherein the heteroaryl contains at least one heteroatom selected from N, O, S and Se, wherein n is an integer of 5 to 2000.

In one implementation, the two-dimensional conjugated polymer contains a repeating unit represented by a following Chemical Formula 2:

[Chemical Formula 2]

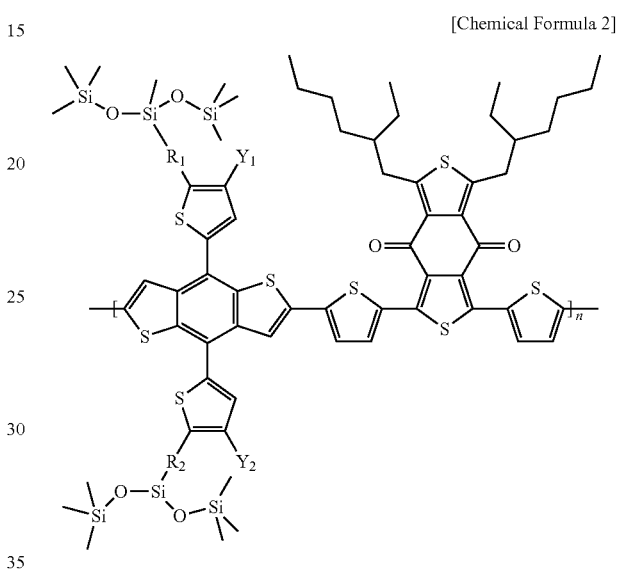

wherein in the Chemical Formula 2, each of $Y_1$ and $Y_2$ independently represents H, F or Cl, wherein each of $R_1$ and $R_2$ independently represents substituted or unsubstituted alkyl having 1 to 30 carbon atoms, cycloalkyl having 3 to 20 carbon atoms, alkylthio having 1 to 30 carbon atoms, halogen, aryl having 6 to 20 carbon atoms, aryl having 6 to 20 carbon atoms substituted with alkyl having 1 to 30 carbon atoms, alkyl having 1 to 30 carbon atoms substituted with aryl having 6 to 20 carbon atoms, or heteroaryl having 3 to 20 carbon atoms, wherein the heteroaryl contains at least one heteroatom selected from N, O, S and Se, wherein n is an integer of 5 to 2000.

In the Chemical Formulas 1 and 2, each of $R_1$ and $R_2$ may be preferably substituted or unsubstituted alkyl having 10 to 30 carbon atoms. Thus, the solubility of the two-dimensional conjugated polymer in an eco-friendly organic solvent may be improved, such that a film of a dense and uniform thickness is formed, thereby to improve the physical and electrical properties of the solar cell.

More preferably, the two-dimensional conjugated polymer may contain a repeating unit represented by a following Chemical Formula 3:

[Chemical Formula 3]

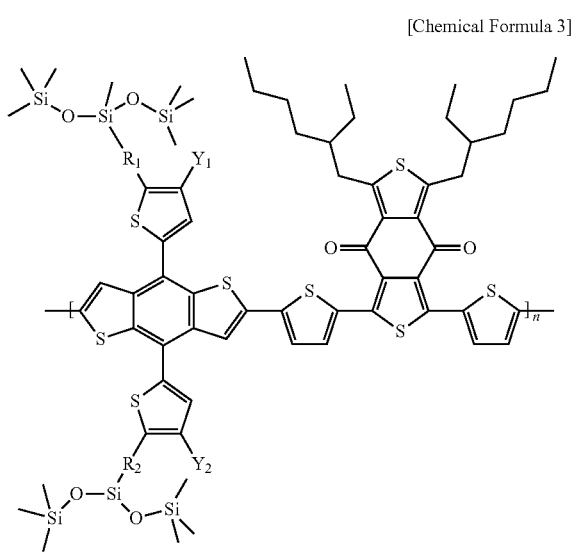

wherein in the Chemical Formula 3, each of $R_1$ and $R_2$ independently represents substituted or unsubstituted alkyl having 1 to 30 carbon atoms, cycloalkyl having 3 to 20 carbon atoms, alkylthio having 1 to 30 carbon atoms, halogen, aryl having 6 to 20 carbon atoms, aryl having 6 to 20 carbon atoms substituted with alkyl having 1 to 30 carbon atoms, alkyl having 1 to 30 carbon atoms substituted with aryl having 6 to 20 carbon atoms, or heteroaryl having 3 to 20 carbon atoms, wherein the heteroaryl contains at least one heteroatom selected from N, O, S and Se, wherein n is an integer of 5 to 2000.

The Chemical Formula 3 has a structure in which each of $Y_1$ and $Y_2$ of the Chemical Formula 2 includes a chlorine atom (Cl). Thus, the chlorine atom may increase the open-circuit voltage by reducing the HOMO energy level of the polymer. Further, molecular planarity and intermolecular assembly of the conjugated polymer may be promoted via strong interactions between C and Cl and between H and C in the conjugated polymer without introducing any steric hindrance that may improve the charge mobility of the conjugated polymer.

In addition, the chlorine atom may increase hydrophobicity such that a polarity of the conjugated polymer may be controlled. Accordingly, high open-circuit voltage and remarkably improved power conversion efficiency (about 13% to 20%) may be exhibited when the polymer is used in the organic solar cell.

In one embodiment, the two-dimensional conjugated polymer may contain a repeating unit represented by a following Chemical Formula 4-1 or 4-2:

[Chemical Formula 4-1]

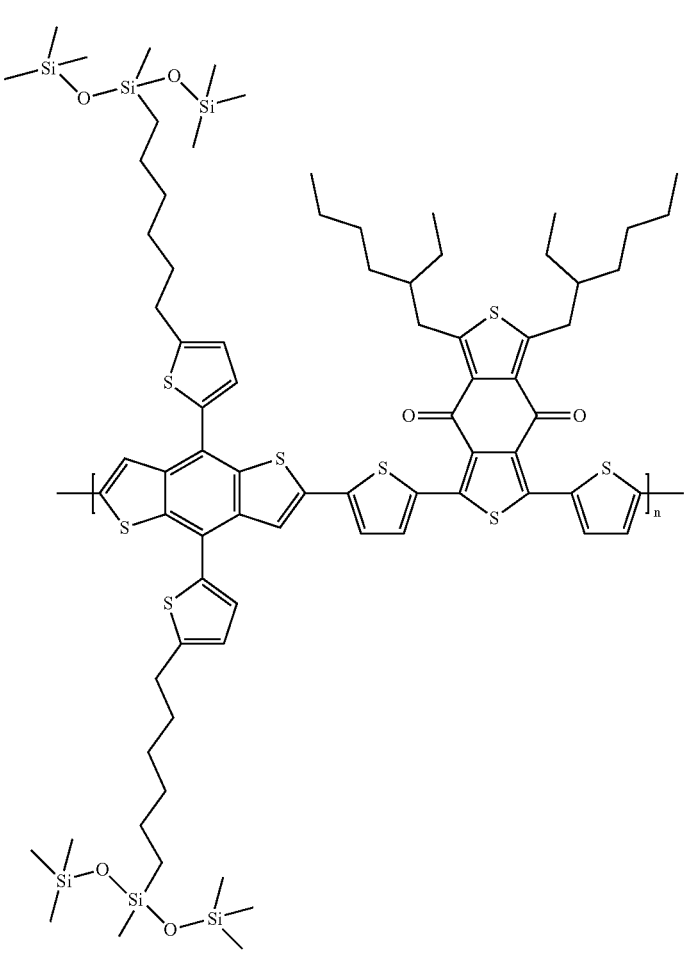

[Chemical Formula 4-2]

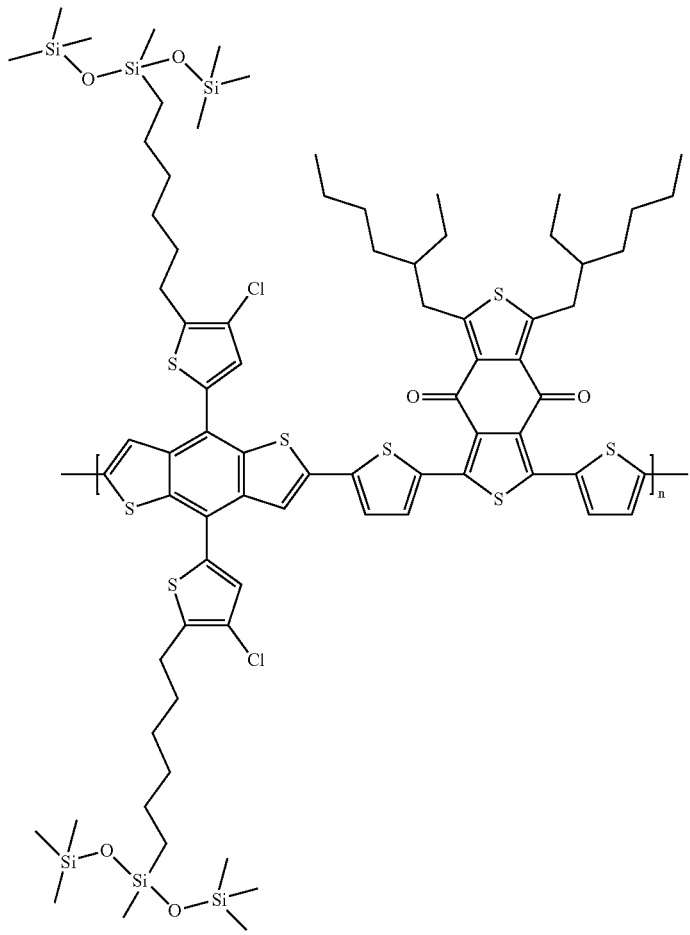

wherein in the Chemical Formula 4-1 and Chemical Formula 4-2, n is an integer of 5 to 2000.

The two-dimensional conjugated polymer has excellent solubility in the eco-friendly organic solvent due to introduction of a siloxane group to an end thereof, and thus may easily form a uniform and dense film without agglomeration. Thus, there is an advantage that the composition containing the polymer may be easily applied to the photo-active layer of the large-area solar cell and module. This two-dimensional conjugated polymer also has excellent thermal/chemical stability.

Further, when the chlorine atom is introduced into the two-dimensional conjugated polymer, the polymer may exhibit excellent electrical properties due to high charge mobility thereof even when the polymer forms a thick film.

Specifically, the HOMO energy level of the two-dimensional conjugated polymer may be in a range of −5.6 to −5.3 eV, and the LUMO energy level thereof may be in a range of −3.7 to −3.5 eV. The charge mobility of the polymer may be in a range of $4.5\times10^{-2}$ to $5.7\times10^{-2}$ $cm^2V^{-1}S^{-1}$.

In one example, the active layer composition for the solar cell according to one embodiment according to the present disclosure may further contain other ingredients than the two-dimensional conjugated polymer based on a type of the solar cell to be manufactured as long as the other ingredients do not disallow the purpose and target properties according to the present disclosure.

In one embodiment, the active layer composition for the solar cell may further contain 100 to 50000 parts by weight of an organic solvent, and 10 to 300 parts by weight of an electron acceptor material based on 100 parts by weight of the two-dimensional conjugated polymer.

The organic solvent may preferably include a non-halogen solvent, but is not limited thereto. An organic solvent as commonly used in the art may be used without particular limitation thereto as long as the solvent may dissolve the two-dimensional conjugated polymer according to an embodiment of the present disclosure.

For example, the non-halogen solvent may include at least one selected from a group consisting of tetrahydrofuran (THF), dimethylformamide (DMF), dimethyl acetamide (DMAC), dimethyl sulfoxide (DMSO), toluene and alcohol. More preferably, the non-halogen solvent may include at least one non-halogen solvent selected from tetrahydrofuran (THF), dimethylformamide (DMF), dimethyl acetamide (DMAC), dimethyl sulfoxide (DMSO), toluene and alcohol.

Further, an amount of the organic solvent to be added may not be particularly limited. In one example, the solvent may be added in an amount of 100 to 50000 parts by weight, preferably 5000 to 30000 parts by weight, based on 100 parts by weight of the two-dimensional conjugated polymer.

The electron acceptor material preferably includes a non-fullerene-based material, but is not limited thereto. A fullerene-based material commonly used in the art may be used.

In this connection, the non-fullerene-based material may include at least one selected from IT-4F, BTP-4F, and BTP-4Cl.

In a specific example, the electron acceptor material may be selected from C60, C70, [60]PCBM(Phenyl C61-butyric acid methyl ester), [70]PCBM(Phenyl C71-butyric acid methyl ester), [60]ICBA (Indene-C60 BisAdduct), [60] PCBCR (phenyl-C61-butyric acid cholestryl ester), [70] PCBCR(phenyl-C71-butyric acid cholestryl ester), perylene, PBI(polybenzimidazole), PTCBI (3,4,9,10-perylene-tetracarboxylic bisbenzimidazole), P(NDI2HD-Se), ITIC (3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene) or ITIC-Th (3,9-bis(2-methylene-(3-(1,1-dicyanomethylene)-indanone))-5,5,11,11-tetrakis(5-hexylthienyl)-dithieno[2,3-d:2',3'-d']-s-indaceno[1,2-b:5,6-b']dithiophene) as a non-fullerene derivative having an indacenodithieno[3,2-b]thiophene) skeleton, and IT-4F, BTP-4F and BTP-4Cl as represented by following structures. However, the present disclosure is not limited thereto.

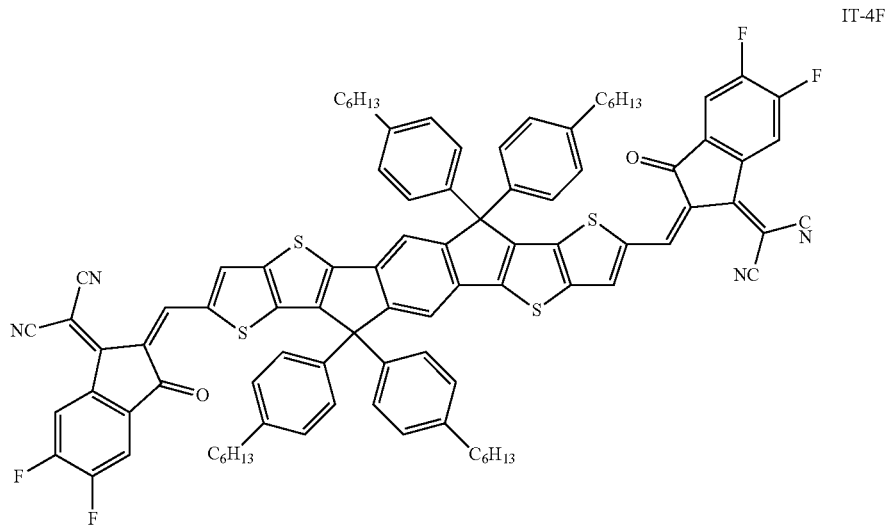

IT-4F

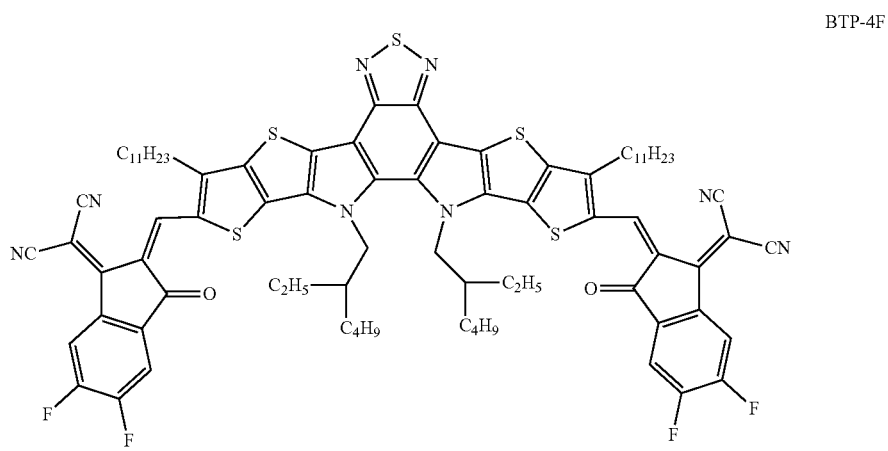

BTP-4F

BTP-4Cl

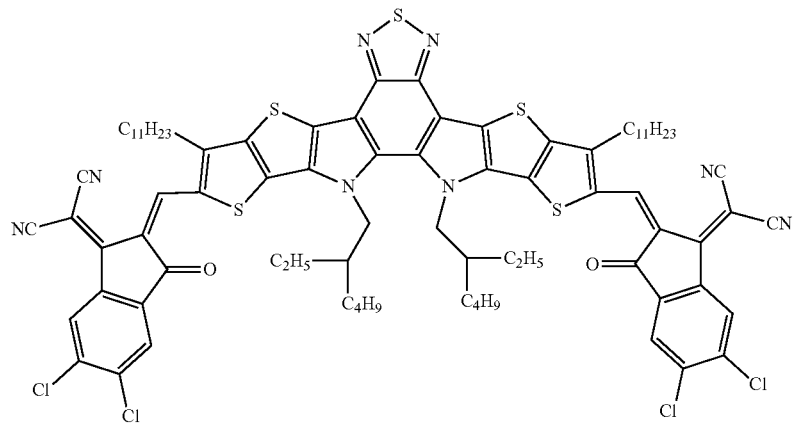

Further, an addition amount of the electron acceptor material is not particularly limited. In one example, the electron acceptor material may be added in an amount of 10 to 300 parts by weight, preferably 50 to 200 parts by weight, based on 100 parts by weight of the two-dimensional conjugated polymer.

The active layer composition for the solar cell according to the present disclosure has high solubility in the eco-friendly organic solvent, and has excellent charge mobility. The composition may contain the two-dimensional conjugated polymer properly fused with the non-fullerene-based electron acceptor material as an electron donor material such that the power conversion efficiency (PCE) value of 13% or greater is achieved in an organic solar cell including a 300 nm-thick photo-active layer.

The active layer composition for the solar cell as described above may be prepared using a following method.

A method for preparing an active layer composition for a solar cell includes performing a polymerizing reaction between a compound represented by a following Chemical Formula 5 and a compound represented by a following Chemical Formula 6 with each other under presence of a palladium catalyst, thereby preparing the two-dimensional conjugated polymer recited above:

[Chemical Formula 5]

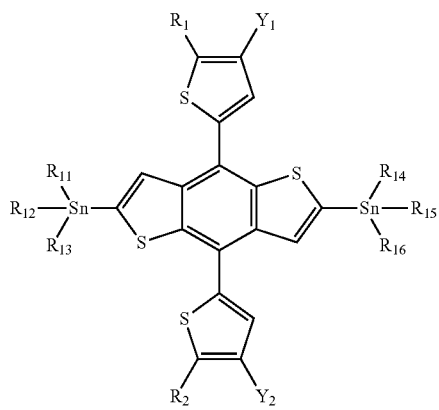

[Chemical Formula 6]

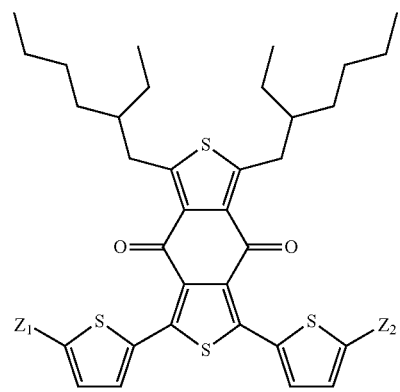

wherein in the Chemical Formula 5 and Chemical Formula 6, each of $Y_1$ and $Y_2$ independently represents H, F or Cl, wherein each of $R_1$ and $R_2$ independently represents substituted or unsubstituted alkyl having 1 to 30 carbon atoms, cycloalkyl having 3 to 20 carbon atoms, alkylthio having 1 to 30 carbon atoms, halogen, aryl having 6 to 20 carbon atoms, aryl having 6 to 20 carbon atoms substituted with alkyl having 1 to 30 carbon atoms, alkyl having 1 to 30 carbon atoms substituted with aryl having 6 to 20 carbon atoms, or heteroaryl having 3 to 20 carbon atoms, wherein the heteroaryl contains at least one heteroatom selected from N, O, S and Se, wherein each of $R_{11}$ and $R_{16}$ independently represents alkyl having 1 to 10 carbon atoms, wherein each of $Z_1$ and $Z_2$ independently represents F, Br or I, wherein n is an integer of 5 to 2000.

Specifically, the reaction may be carried out via Stille polycondensation under presence of a palladium-based catalyst. The palladium-based catalyst may include, for example, tetrakis(triphenylphosphine)palladium(0) (Pd(PPh$_3$)$_4$)), palladium acetate (Palladium (II) acetate (Pd(OAc)$_2$)), and tris(dibenzylideneacetone)dipalladium(0) (Pd$_2$(dba)$_3$), etc. Further, an addition amount thereof may be in a range of 0.001 to 1 mole based on 1 mole of the compound represented by the Chemical Formula 5. More preferably, the catalyst may be added in an amount of 0.01 to 0.1 mole based on 1 mole of the compound represented by the Chemical Formula 5.

In one example, the reaction may be carried out by adding a poorly electron donating ligand together with the palladium-based catalyst in order to improve a reaction rate. In this connection, the electron donating ligand may include at least one selected from a group consisting of tri(2furyl)phosphine (P(furyl)$_3$), tri(o-tolyl)phosphine (P(o-tol)$_3$), triphenylphosphine (PPh$_3$), tri-tert-butylphosphine (P(t-bu)$_3$) and copper iodide (CuI). However, the present disclosure is not limited thereto.

The added amount of the electron donating ligand may be in a range of 0.01 to 1 mole based on 1 mole of the compound represented by the Chemical Formula 5. More preferably, the added amount of the electron donating ligand may be in a range of 0.1 to 0.5 mole based on 1 mole of the compound represented by the Chemical Formula 5.

Further, the reaction may be carried out for about 30 minutes to 4 hours at a temperature of 100 to 250° C. under presence of the electron donating ligand and in an inert gas atmosphere.

In another embodiment of the present disclosure, an organic solar cell including the photo-active layer containing the composition for the solar cell may be provided.

Referring to FIG. 1, the organic solar cell according to an embodiment of the present disclosure may include a substrate; a first electrode disposed on the substrate; a photo-active layer disposed on the first electrode and containing the composition for the solar cell; and a second electrode disposed on the photo-active layer, wherein the photo-active layer has a bulk binary junction or a bulk ternary junction in which one type of an electron donor material and at least one type of a non-fullerene-based electron acceptor material are mixed with each other.

The substrate may be a glass or quartz plate. In another example, the substrate may be made of a flexible and transparent material such as a plastic including PET (polyethyleneterephthalate), PEN (polyethylene naphthelate), PP (polyperopylene), PI (polyimide), PC (polycarbornate), PS (polystylene), POM (polyoxyethlene), AS resin (acrylonitrile styrene) copolymer), ABS resin (acrylonitrile butadienestyrene copolymer) and TAC (Triacetyl cellulose).

The first electrode is disposed on the substrate. Sputtering, E-beam, thermal evaporation, spin coating, screen printing, inkjet printing, doctor blade or gravure printing method may be used to apply a transparent electrode material to one face of the substrate in a form of a coating film, thereby to form the first electrode. The first electrode may function as an anode, and may be made of a material having a higher work function than that of the second electrode described later, and may include any material having transparency and conductivity.

For example, ITO (indium tin oxide), fluorine doped tin oxide (FTO), aluminum doped zinc oxide (AZO), IZO (indium zinc oxide), ZnO—Ga$_2$O$_3$, Zn$_O$—Al$_2$O$_3$ and ATO (antimony tin oxide), etc. preferably, ITO may be used as the material of the first electrode.

The photo-active layer may be disposed on the first electrode, may contain the composition for the solar cell, as defined above.

Specifically, the photo-active layer has a bulk binary junction structure or a bulk ternary junction structure in which one type of electron donor material (donor, D) and at least one type of non-fullerene-based electron acceptor material (acceptor, A) are mixed with each other. A fabrication process of the structure is simple and an area of an interfaced between D/A (donor/acceptor) is greatly increased, thus increasing possibility of charges separation and increasing charge collection efficiency into the electrode.

In this connection, the electron donor material may include the two-dimensional conjugated polymer according to an embodiment of the present disclosure. The non-fullerene-based electron acceptor material preferably include-s at least one non-fullerene-based material selected from IT-4F, BTP-4F, and BTP-4Cl, but is not limited thereto. A fullerene-based material may be used.

The second electrode may be disposed on the photo-active layer, and may be deposited thereon using a thermal evaporator. Specific examples of materials of the second electrode may include lithium fluoride/aluminum, lithium fluoride/calcium/aluminum, calcium/aluminum, barium fluoride/aluminum, barium fluoride/barium/aluminum, barium/aluminum, aluminum, gold, silver, magnesium: silver or lithium: aluminum, etc. Preferably, aluminum, silver or lithium fluoride/aluminum may be used.

In one example, the organic solar cell may further contain a hole transport layer disposed between the first electrode and the photo-active layer, and an electron transport layer disposed between the second electrode and the photo-active layer.

In the above-described general organic solar cell, electrons moves to an cathode and holes moves to an anode. However, in a reverse organic solar cell, electrons move to the anode and holes moves to the cathode. The present disclosure may include both type solar cells.

Therefore, in one embodiment, poly(3,4-ethylenedioxythiophene):poly(4-styrenesulfonate)[PEDOT:PSS] is preferably used as the hole transport layer of the organic solar cell having a typical structure according to the present disclosure. This is because the holes are smoothly transferred to the anode (ITO) layer while electrons are prevented from moving to the anode ITO (indium tin oxide) layer.

In another example, it is preferable to use molybdenum trioxide (MoO$_3$) as the material of the hole transport layer of an organic solar cell having a reverse structure according to the present disclosure. This is because molybdenum trioxide helps hole transport smoothly to the cathode while preventing electrons from moving to the cathode.

The electron transport layer includes a metal oxide layer containing a metal oxide. The metal oxide may include nanoparticle oxides such as titanium dioxide (TiO$_2$), tin dioxide (SnO$_2$), and zinc oxide (ZnO). However, the present disclosure is not limited thereto.

The organic solar cell according to the present disclosure may be applied to a large area process because the change in charge mobility is not large due to the high charge mobility of the donor polymer even when a thick active layer is formed.

Hereinafter, various Examples and Experimental Examples according to the present disclosure will be described in detail. However, the following Examples are only some examples according to the present disclosure, and the present disclosure should not be interpreted as being limited to the following Examples.

[Synthesis Example 1] Compound D1 Synthesis

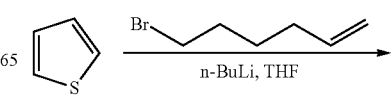

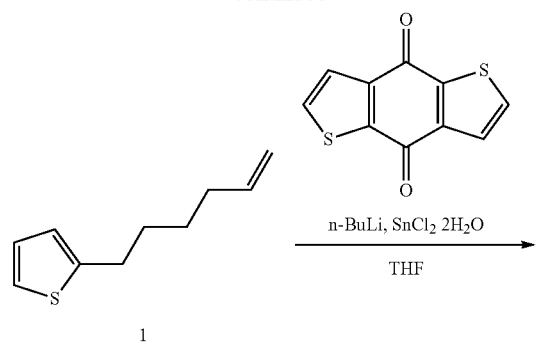

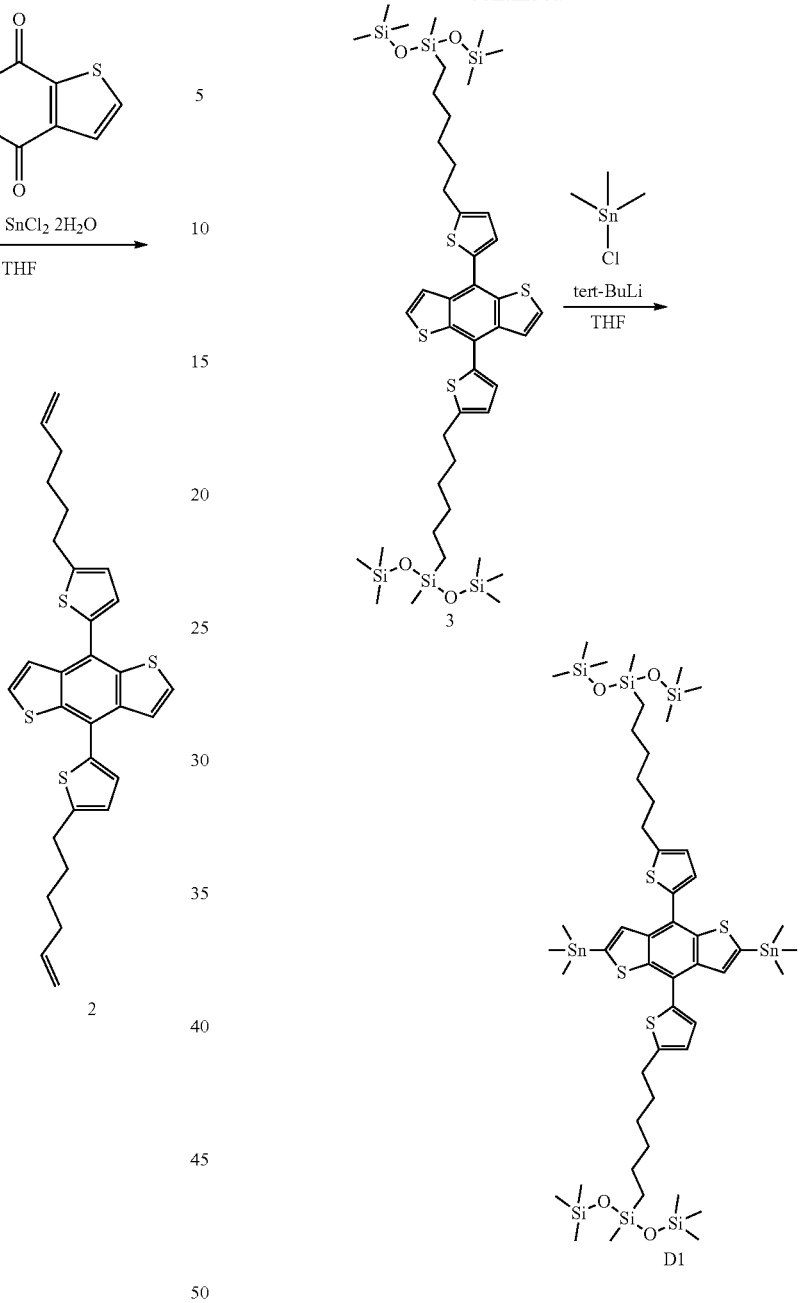

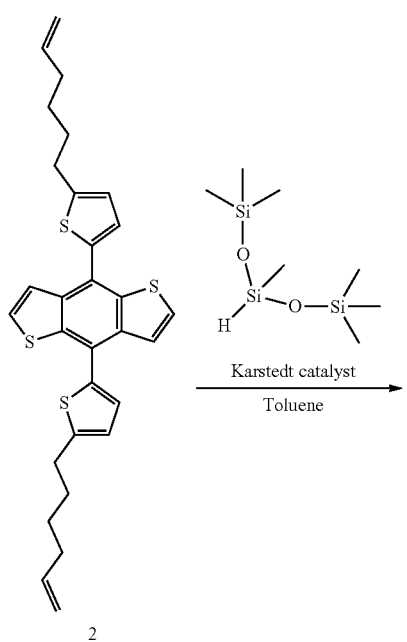

Compound 1(2-(hex-5-en-1-yl)thiophene) Synthesis

Thiophene (13.74 mL, 171 mmol) was added to a two-necked flask containing anhydrous THF (25 mL). After slowly adding n-butyllithium (10.79 mL, 26 mmol) thereto at 0° C., a mixture was stirred at room temperature for 20 minutes. Then, 6-bromo-1-hexane (4.00 g, 24 mmol) was added thereto and the mixture was refluxed for 72 hours. After cooling the mixture to room temperature, distilled water was added thereto to terminate the reaction. After extracting an organic layer using methylene chloride, water was removed therefrom with sodium sulfate ($Na_2SO_4$). Then, the organic layer free of water was evaporated under reduced pressure to remove the solvent. The organic layer was subjected to a separation process using silica gel column chromatography to obtain 2.82 g (Yield: 69%) of a colorless liquid (1).

$^1$H NMR (300 MHz, CDCl3) δ 7.10 (dd, 1H), 6.91 (dd, 1H), 6.78 (dd, 1H), 5.80 (m, 1H), 4.98 (m, 2H), 2.83 (m, 2H), 2.09 (m, 2H), 1.70 (m, 2H), 1.47 (m, 2H).

Compound 2 (4,8-bis(5-(hex-5-en-1-yl)thiophen-2-yl)benzo[1,2-b:4,5-b']dithiophene) Synthesis We put the compound 1 (2.00 g, 12.02 mmol) in a two necked flask and dissolved the compound 1 in anhydrous THF (25 mL). Thereafter, the solution was cooled to 0° C., and n-butyllithium (5.29 mL, 13.22 mmol) was slowly added thereto. Next, we stirred the solution for 2 hours at a temperature of 50° C. 4,8-dihydrobenzo[1,2-b:4,5-b]dithiophene-4,8-dione (1.32 g, 5.99 mmol) was added thereto dropwise, and the mixture was stirred for 2 hours. After cooling the mixture to room temperature, tin chloride dihydrate ($SnCl_2.2H_2O$) (10.85 g, 48.08 mmol) dissolved in a mixed solution ($H_2O$:HCl 7:3 v/v) (10 mL) was added thereto and the mixture was stirred for 12 hours. Thereafter, distilled water was added thereto to terminate the reaction. After extraction with methylene chloride, water was removed from the extract with sodium sulfate ($Na_2SO_4$) and the extract free of water was subjected to a separation process using silica gel column chromatography to obtain 2.18 g (Yield: 70%) of a pale yellow solid material (2).

$^1$H NMR (300 MHz, CDCl$_3$) δ 7.64 (d, 2H), 7.45 (d, 2H), 7.29 (d, 2H), 6.92 (d, 2H), 5.85 (m, 2H), 5.02 (m, 4H), 2.93 (m, 4H), 2.15 (m, 4H), 1.87-1.74 (m, 4H), 1.56 (m, 4H).

Compound 3 (4,8-bis(5-(6-(1,1,1,3,5,5,5-heptamethyltrisiloxan-3-yl)hexyl)thiophen-2-yl)benzo[1,2-b:4,5-b']dithiophene) synthesis The dissolving compound 2 (2.18 g, 4.20 mmol) and 1,1,1,3,5,5,5-heptamethyltrisiloxane (4.56 mL, 16.78 mmol) were dissolved in toluene (20 mL), and Karstedt's catalyst (1.00 mL) was added thereto. Thereafter, after stirring at 50° C. for 12 hours, the solvent was removed via evaporation under reduced pressure. Using silica gel column chromatography, 3.14 g (Yield: 77%) of a yellow liquid (3) was obtained.

$^1$H NMR (300 MHz, CDCl$_3$) δ 7.65 (d, 2H), 7.45 (d, 2H), 7.29 (d, 2H), 6.91 (d, 2H), 2.92 (m, 4H), 1.77 (m, 4H), 1.39 (m, 12H), 0.52-0.45 (m, 4H), 0.10 (s, 36H), 0.01 (s, 6H).

Compound D1 (3,3'-((5,5'-(2,6-bis(trimethylstannyl)benzo[1,2-b:4,5-b']dithiophene-4,8-diyl)bis(thiophene-5,2-diyl))bis(hexane-6,1-diyl))bis(1,1,1,3,5,5,5-heptamethyltrisiloxane)) synthesis The compound 3 (1.00 g, 1.03 mmol) was dissolved in anhydrous THF (20 mL), and the solution was cooled to −78° C. in a nitrogen atmosphere, and tert-BuLi (2.44 mL, 4.14 mmol) was added thereto. After stirring at −78° C. for 30 minutes, trimethyltin chloride (4.15 mL, 4.15 mmol) was quickly added thereto. After stirring at room temperature for 12 hours, sodium hydrogen carbonate ($NaHCO_3$) solution was added to the reaction product. After extraction with methylene chloride, water was removed from the extract using sodium sulfate ($Na_2SO_4$). Thereafter, the extract free of the water was recrystallized with ethanol to obtain 1.00 g (Yield: 75%) of the compound D1 as a yellow solid material.

$^1$H NMR (300 MHz, CDCl$_3$) δ 7.69 (s, 2H), 7.31 (d, 2H), 6.93 (d, 2H), 2.93 (m, 4H), 1.78 (m, 4H), 1.40 (m, 12H), 0.52-0.28 (m, 22H), 0.09 (s, 36H), 0.01 (s, 6H).

$^{13}$C NMR (75 MHz, CDCl$_3$) δ 146.79, 143.24, 142.22, 137.73, 137.27, 131.16, 127.63, 124.13, 122.37, 33.02, 31.56, 30.34, 29.12, 23.07, 17.65, 2.30, 1.91, 1.52, −0.22, −5.84, −5.95, −8.30, −10.65, −10.76.

[Synthesis Example 2] Compound D2 Synthesis

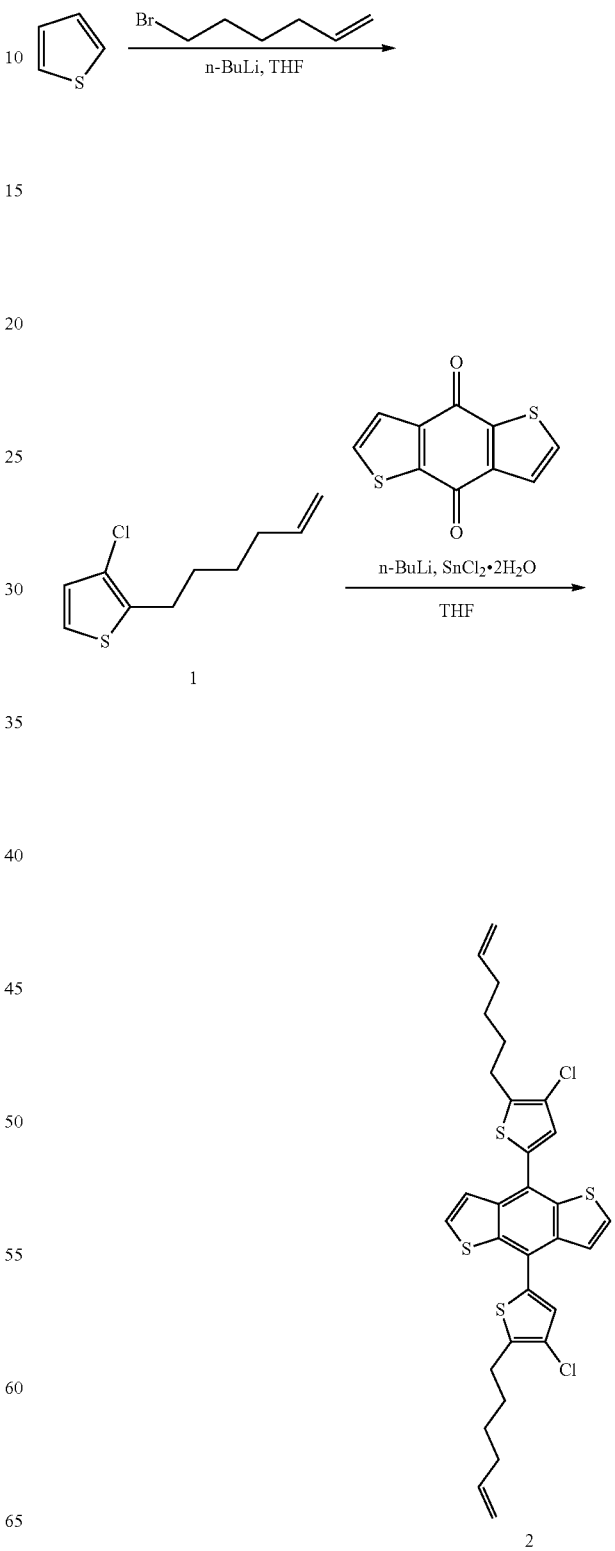

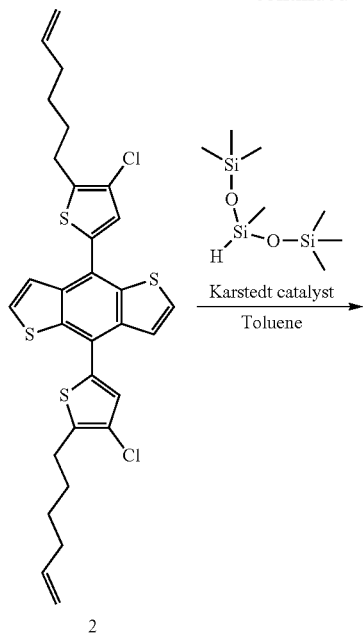

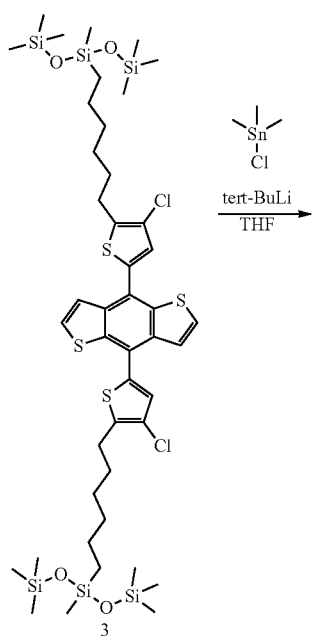

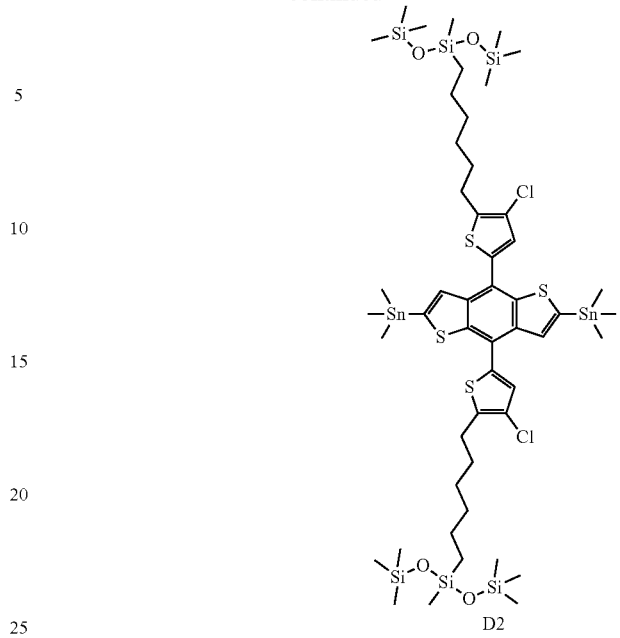

Compound 1(3-chloro-2-(hex-5-en-1-yl)thiophene) Synthesis

In a 50 ml two necked flask, 3-chlorothiophene (0.5 g, 4.21 mmol) was completely dissolved in anhydrous THF (10 mL) under a nitrogen atmosphere and the solution was cooled to −78° C. Lithium diisopropylamide (LDA) (2M, 2.52 mL) was slowly added dropwise thereto and the solution was kept at −78° C. for 30 minutes. Next, 6-bromo-1-hexane (0.67 mL, 5.01 mmol) was added dropwise thereto, followed by stirring at room temperature for 12 hours. The reaction was terminated by adding distilled water to the solution. After extraction with methylene chloride, water was removed from the extract with sodium sulfate ($Na_2SO_4$) and the extract free of the water was subjected to a separation process using silica gel column chromatography to obtain 0.58 g (Yield: 68%) of compound 1 as a green liquid.

$^1$H NMR (300 MHz, $CDCl_3$) δ 7.09 (dd, 1H), 6.85 (dd, 1H), 5.88-5.74 (m, 1H), 5.05-4.94 (m, 2H), 2.83-2.76 (m, 2H), 2.10 (m, 2H), 1.66 (m, 2H), 1.51-1.45 (in, 2H).

Compound 2 (4,8-bis(4-chloro-5-(hex-5-en-1-yl)thiophen-2-yl)benzo[1,2-b:4,5-b']dithiophene) Synthesis We put the compound 1 (0.5 g, 2.50 mmol) in a two necked flask and dissolve the compound 1 in anhydrous THF (15 mL). Thereafter, the solution was cooled to 0° C. and n-butyllithium (1.1 mL, 2.74 mmol) was slowly added thereto. Next, stirring for 2 hours at a temperature of 50° C. was carried out. Then, 4,8-dihydrobenzo[1,2-b:4,5-b]dithiophene-4,8-dione (0.27 g, 1.25 mmol) was added dropwise thereto, the mixed solution was stirred for 2 hours. After cooling the mixed solution to room temperature, tin chloride dihydrate ($SnCl_2.2H2_O$) (2.3 g, 10.0 mmol) dissolved in the mixed solution ($H_2O$:HCl 7:3 v/v) (2.5 mL) was added, followed by stirring for 12 hours. Thereafter, distilled water was added thereto to terminate the reaction. After extraction with methylene chloride, moisture was removed from the extract with sodium sulfate ($Na_2SO_4$) and the extract was separated using silica gel column chromatography to obtain 0.35 g (Yield: 55%) of a yellow solid material (2).

$^1$H NMR (300 MHz, CDCl$_3$) δ 7.61 (d, 2H), 7.49 (d, 2H), 7.23 (s, 2H), 5.83 (m, 2H), 5.02 (m, 4H), 2.91 (m, 4H), 2.15 (m, 4H), 1.82-1.71 (m, 4H), 1.62-1.51 (m, 4H).

Compound 3 (4,8-bis(4-chloro-5-(6-(1,1,1,3,5,5,5-heptamethyltrisiloxan-3-yl)hexyl)thiophen-2-yl)benzo[1,2-b:4,5-b']dithiophene) synthesis After dissolving the compound 2 (0.35 g, 0.59 mmol) and 1,1,1,3,5,5,5-heptamethyltrisiloxane (0.64 mL, 2.36 mmol) in toluene (15 mL), Karstedt's catalyst (0.2 mL) was added thereto. Thereafter, after stirring the solution at 50° C. for 12 hours, the solvent was removed therefrom via evaporation under reduced pressure, and 0.44 g (Yield: 77%) of a yellow liquid (3) is separated therefrom using silica gel column chromatography. The yellow liquid compound (3) is as follows:

$^1$H NMR (300 MHz, CDCl$_3$) δ 7.61 (d, 2H), 7.49 (d, 2H), 7.23 (s, 2H), 2.89 (m, 4H), 1.74 (m, 4H), 1.39 (m, 12H), 0.48 (m, 4H), 0.09 (s, 36H), 0.00 (s, 6H).

Compound D2 (3,3'-((5,5'-(2,6-bis(trimethylstannyl)benzo[1,2-b:4,5-b']dithiophene-4,8-diyl)bis(3-chlorothiophene-5,2-diyl))bis(hexane-6,1-diyl))bis(1,1,1,3,5,5,5-heptamethyltrisiloxane)) synthesis The compound 3 (0.44 g, 0.42 mmol) was dissolved in anhydrous THF (10 mL). After cooling the solution to −78° C. in a nitrogen atmosphere, tert-BuLi (1.00 mL, 1.69 mmol) was added thereto. After stirring at −78° C. for 30 minutes, trimethyltin chloride (1.70 mL, 1.69 mmol) was quickly added thereto. After stirring at room temperature for 12 hours, sodium hydrogen carbonate (NaHCO$_3$) solution was added to the reaction product. After extraction with methylene chloride, water was removed from the extract with sodium sulfate (Na$_2$SO$_4$). Thereafter, the extract was recrystallized with ethanol to obtain a yellow solid material 0.44 g (Yield: 75%) of the compound D2.

$^1$H NMR (300 MHz, CDCl$_3$) δ 7.63 (s, 2H), 7.24 (s, 2H), 2.93-2.86 (m, 4H), 1.76 (m, 4H), 1.39 (m, 12H), 0.52-0.30 (m, 22H), 0.09 (s, 36H), 0.00 (s, 6H).

$^{13}$C NMR (75 MHz, CDCl$_3$) δ 143.30, 143.16, 138.88, 137.28, 136.34, 130.58, 127.86, 121.75, 121.52, 32.89, 30.50, 29.03, 28.00, 23.02, 17.62, 2.27, 1.87, 1.48, −0.26, −5.81, −5.92, −8.28, −10.64, −10.75.

[Synthesis Example 3] Synthesis of Compound A1

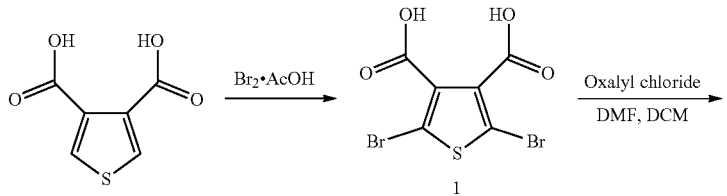

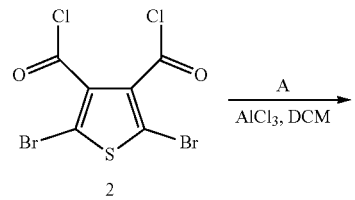

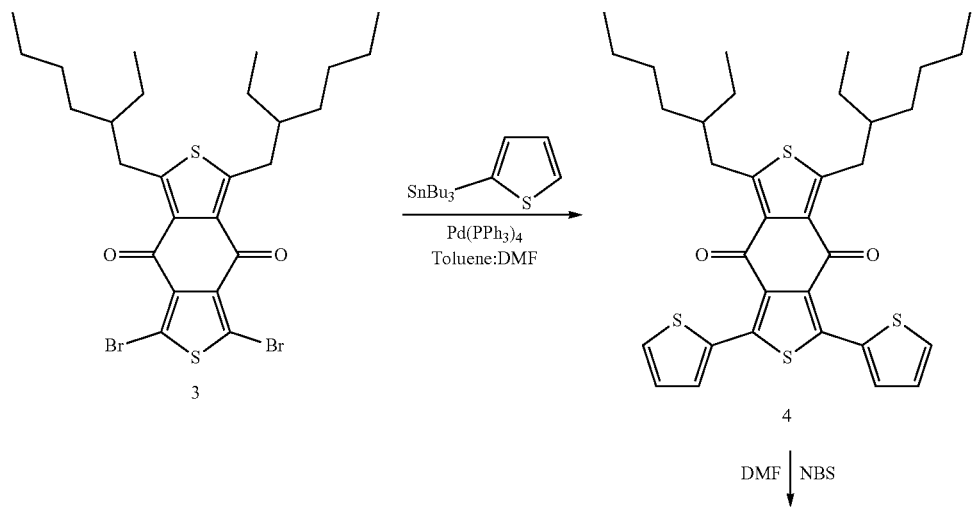

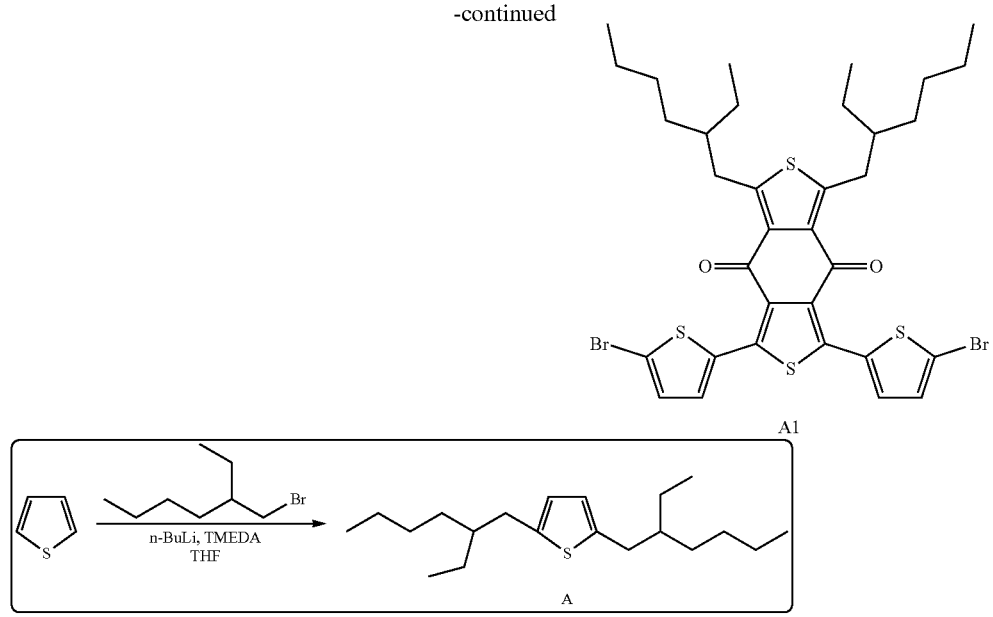

A1

Synthesis of Compound A
(2,5-bis(2-ethylhexyl)thiophene)

100 mL of THF and thiophene (3.4 g, 40 mmol) were added to a 250 mL round flask from which air was removed, followed by stirring, and then, n-butyllithium (2.5 M, 35.2 mL) was slowly added dropwise thereto at 0° C. After stirring at room temperature for 1 hour, the mixture was stirred at 50° C. for 2 hours. Then, 2-ethylhexyl bromide (19.5 g, 101 mmol) was added thereto and refluxed. The reaction was terminated by adding distilled water thereto. After extraction with methylene chloride, moisture was removed from the extract with sodium sulfate ($Na_2SO_4$), and the solvent was removed therefrom via evaporation under reduced pressure. Thereafter, the extract free of the water and solvent was purified using silica gel column chromatography to obtain 9.47 g (76%) of colorless material compound A.

Synthesis of Compound 1
(2,5-dibromothiophene-3,4-dicarboxylic acid)

Thiophene-3,4-dicarboxylic acid (10.00 g, 58.2 mmol) was added to a 500 mL two necked flask, and then was dissolved in acetic acid (100 mL) therein. Bromine (18.00 mL, 348 mmol) was slowly added thereto, followed by stirring at room temperature for 12 hours. Next, an aqueous solution of sodium bisulfate was added thereto until the red color disappeared. After cooling thereof, the reaction solution was filtered. A precipitate was washed several times with cold distilled water. Moisture was sufficiently removed therefrom to obtain 10.6 g (Yield: 55%) of gray solid material compound 1.

Synthesis of Compound 2
(2,5-dibromothiophene-3,4-dicarbonyl dichloride)

The compound 1 (9.90 g, 30 mmol) was dissolved in anhydrous methylene chloride (40 mL), and DMF (2 drop) was added dropwise thereto. Thereafter, oxalyl chloride (20 mL) was slowly added thereto, followed by stirring at room temperature for 12 hours. The solvent was removed therefrom via evaporation under reduced pressure to obtain a pale green compound 2. This compound 2 was used in a next synthetic step without further purification.

Compound 3 (1,3-dibromo-5,7-bis(2-ethylhexyl) benzo[1,2-c:4,5-c']dithiophene 4,8-dione) synthesis The compound 2 (5.50 g, 15 mmol) and compound (A) (4.62 g, 15 mmol) were dissolved in anhydrous 1,2-dichloroethane, followed by stirring. Aluminum chloride (8.00 g, 60 mmol) was added thereto at 0° C. After stirring at the same temperature for 30 minutes, the mixture was stirred at room temperature for 3 hours. Then, cold distilled water and 1M hydrochloric acid were added thereto to terminate the reaction. Next, an organic layer was extracted from the mixed solution by adding methylene chloride to the mixed solution, and the moisture was removed from the organic layer with sodium sulfate ($Na_2SO_4$) and the organic layer free of the water was evaporated under reduced pressure to remove the solvent therefrom. Then, the organic layer was subjected to a separation process using silica gel column chromatography, thereby to obtain 6.3 g (Yield: 70%) of compound 3 as a pale yellow solid material.

$^1$H NMR (300 MHz, CDCl$_3$) δ 3.31 (m, 4H), 1.77 (m, 2H), 1.43-1.26 (m, 16H), 0.92-0.86 (m, 12H).

Compound 4 (1,3-bis(2-ethylhexyl)-5,7-di(thiophen-2-yl)benzo[1,2-c:4,5-c']dithiophene-4,8-dione) synthesis The Compound 3 (1.80 g, 3 mmol) and tributyl (thiophen-2-yl) stannane (3.4 g, 9 mmol) were dissolved in anhydrous toluene (20 ml). After tetrakis(triphenylphosphine) palladium (Pd(PPh$_3$)$_4$) (40 mg) was added thereto, and the mixed solution was refluxed in a nitrogen atmosphere for 12 hours. The solvent was removed therefrom via evaporation under reduced pressure, and then the product was subjected to a separation process using silica gel column chromatography to obtain 1.73 g (Yield: 95%) of compound 4 as a yellow/orange solid material.

$^1$H NMR (300 MHz, CDCl$_3$) δ 3.31 (m, 4H), 1.77 (m, 2H), 1.43-1.26 (m, 16H), 0.92-0.86 (m, 12H).

Compound A1 (1,3-bis(5-bromothiophen-2-yl)-5,7-bis(2-ethylhexyl)benzo[1,2-c:4,5c']dithiophene-4,8-dione) Synthesis The compound 4 (1.60 g, 2.6 mmol) was completely dissolved in DMF (20 mL). After blocking the light, N-bromosuccinimide (NBS) (0.95 g, 5.3 mmol) was added thereto, followed by stirring at room temperature for 3 hours. Then, after adding cold distilled water thereto to terminate the reaction, extraction was performed using chloroform to obtain an extract. Moisture was removed from the extract with sodium sulfate (Na$_2$SO$_4$) and the extract was subjected to a separation process using silica gel column chromatography to obtain 1.17 g (Yield: 60%) of compound A1 as a red solid.

$^1$H NMR (300 MHz, CDCl$_3$) δ 7.38 (s, 2H), 3.30 (m, 4H), 2.53 (m, 4H), 1.76 (m, 2H), 1.64 (m, 2H), 1.41-1.31 (m, 32H), 0.94-0.79 (m, 24H).

$^{13}$C NMR (75 MHz, CDCl$_3$) δ 177.37, 153.54, 141.57, 141.11, 132.64, 131.70, 131.26, 116.25, 41.13, 39.96, 33.69, 33.63, 32.84, 32.45, 28.87, 28.78, 26.05, 25.66, 23.09, 23.0, 14.16, 10.87, 10.84.

[Example 1] Preparation of P1

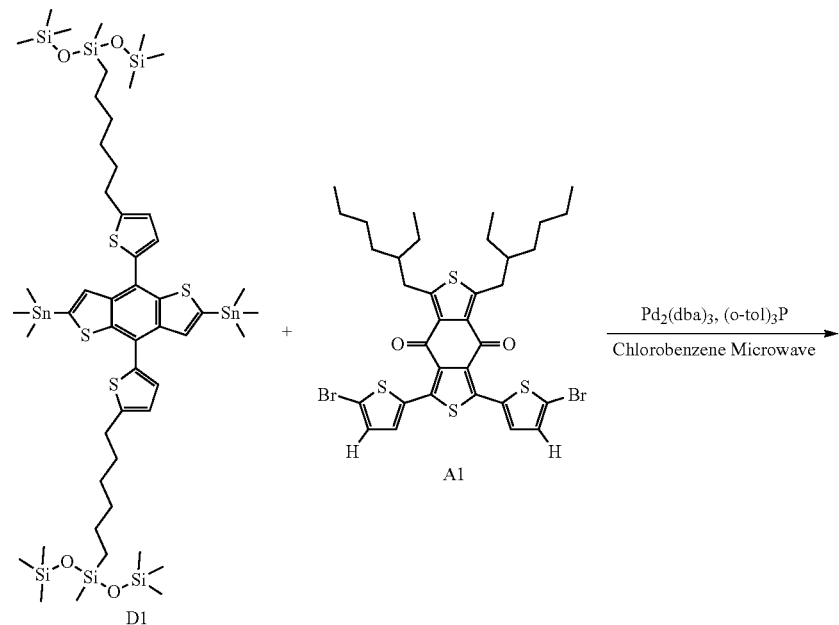

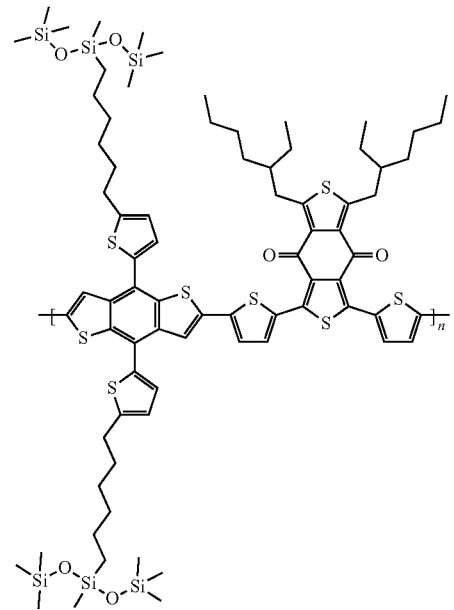

P1 (Poly[1-(5-(4,8-bis(5-(6-(1,1,1,3,5,5,5-heptam-ethyltrisiloxan-3-yl)hexyl)thiophen-2-yl)benzo[1,2-b:4,5-b']dithiophen-2-yl)thiophen-2-yl)-5,7-bis(2-ethylhexyl)-3-(thiophen-2-yl)benzo[1,2-c:4,5-c']dithiophene-4,8-dione]) synthesis A microwave tube receives the material compound D1 (200 mg, 0.155 mmol, 1 eq), the compound A1 (119 mg, 0.155 mmol, 1 eq), Pd$_2$(dba)$_3$ (5.4 mg, 2 mol %), and (o-tol)$_3$P (16 mg, 16 mol %) which were was dissolved in anhydrous chlorobenzene therein. Then, nitrogen was added thereto for 30 minutes to remove air from the tube. A first reaction was carried out at 150° C. for 1 hour, a second reaction at 120° C. for 30 minutes, and a third reaction at 150° C. for 3 hours. Next, after cooling the tube to room temperature, methanol was added to the reaction solution to from precipitate, and then the precipitate was purified by a Soxhlet extraction apparatus using methanol, acetone, hexane, ethyl acetate, and chloroform. The chloroform fraction was reprecipitated in methanol after removing the solvent, and then the precipitate was filtered and dried in a vacuum state to obtain a dark brown solid polymer P1. First reactant (Yield: 90%), second reactant (Yield: 98%), third reactant (Yield: 94%)

$^1$H NMR (300 MHz, CDCl$_3$) δ 7.73-6.22 (br, 10H), 2.96 (br, 8H), 1.94-1.18 (br, 34H), 0.88 (br, 12H), 0.52 (br, 4H), 0.10 (br 42H).

[Example 2] Preparation of P2

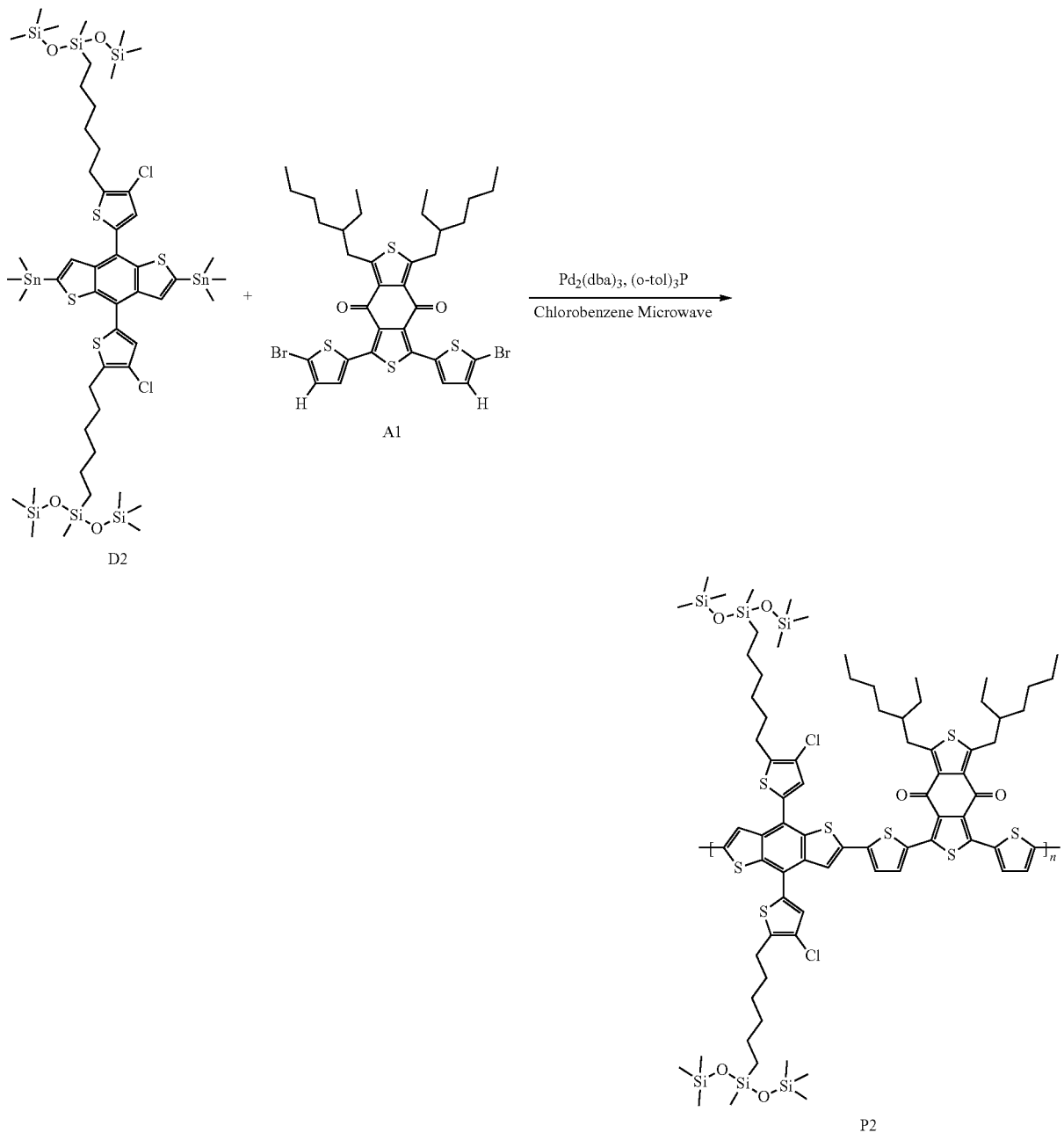

P2 (3.4.3.Poly[1-(5-(4,8-bis(4-chloro-5-(6-(1,1,1,3,
5,5,5-heptamethyltrisiloxan3-yl)hexyl)thiophen-2-yl)
benzo[1,2-b:4,5-b']dithiophen-2-yl)thiophen-2-yl)-5,
7-bis(2-ethylhexyl)-3-(thiophen-2-yl)benzo[1,2-c:4,
5-c']dithiophene-4,8-dione]) Synthesis A microwave tube receives the compound D2 (200 mg, 0.147 mmol, 1 eq), the compound A1 (113 mg, 0.147 mmol, 1 eq), Pd$_2$(dba)$_3$ (5.4 mg, 2 mol %), and (o-tol)$_3$P (16 mg, 16 mol %) and were dissolved in anhydrous chlorobenzene therein. Then, nitrogen was added thereto for 30 minutes to remove air from the tube. The first reaction was carried out at 120° C. for 30 minutes, the second reaction at 150° C. for 30 minutes, and the third at 180° C. for 30 minutes. Next, after cooling the tube to room temperature, methanol was added to the reaction solution to form precipitate, and then the precipitate was purified by a Soxhlet extraction apparatus using methanol, acetone, hexane, ethyl acetate, and chloroform. The chloroform fraction was reprecipitated in methanol after removing the solvent, and then the precipitate was filtered and dried in a vacuum state to obtain a dark brown solid polymer P2. First reactant (Yield: 91%), second reactant (Yield: 89%), third reactant (Yield: 89%)

$^1$H NMR (300 MHz, CDCl$_3$) δ 7.74-6.81 (br, 8H), 2.96 (br, 8H), 1.92-1.29 (br, 34H), 0.88 (br, 12H), 0.52 (br, 4H), 0.09 (br, 42H).

Property Evaluation of Two-Dimensional Conjugated Polymer

Tables 1 and 2 below show solubility in organic solvents and physical properties of the two-dimensional conjugated polymer synthesized via Examples 1 and 2.

2) Evaluation of Optical Properties

In order to evaluate the optical properties of P1 and P2 synthesized according to the Examples, the UV absorption spectrum of each of solutions in which P1 and P2 were dissolved in chlorobenzene (CB) was measured. The results are shown in FIG. 2A.

Referring to FIG. 2A which shows the absorption peaks of P1 and P2, 450 to 700 nm corresponds to an intramolecular charge transfer, and 300 to 400 nm corresponds to a π-π* transition. Further, in the P1 film, maximum absorption peaks were observed at 581 nm and 623 nm. The maximum absorption peaks were observed at 578 nm and 617 nm in the P2 film.

From the above results, it may be seen that P2 having the chlorine atom introduced thereinto exhibits a higher absorption coefficient than P1 does. This indicates that P2 into which a chlorine atom is introduced absorbs more photons than P1 does, thereby improving the short-circuit current (Jsc).

Further, band gaps (Eg$^{opt}$) of P1 and P2 were calculated as 1.81 eV and 1.84 eV, respectively. It may be seen that the P1 and P2 are compatible with NFA materials because P1 and P2 have such a wide bandgap.

3) Thermal Stability Evaluation

To evaluate the thermal stability of P1 and P2 synthesized according to Examples, TGA and DSC of P1 and P2 were measured. The results are shown in FIG. 2B and FIG. 2C, respectively.

As shown in FIG. 2B and FIG. 2C, P1 and P2 have almost no weight loss until the temperature of 400° C. A phase

TABLE 1

| Polymer | Solvent | | | | | | Solubility limit (mg/mL) |
| --- | --- | --- | --- | --- | --- | --- | --- |
| | Toluene | Toluene(DPE) | CPME | CPME(DPE) | CB | CB(DPE) | |
| P1 | Δ | Δ | Δ | Δ | Δ | Δ | 10 |
| P1:IT-4F | Δ | O | X | Δ | X | Δ | — |
| P1:IT-4F:BTP-4Cl | Δ | O | X | Δ | X | Δ | — |
| P2 | O | O | O | O | O | O | 25 |
| P2:IT-4F:BTP-4Cl | Δ | O | X | Δ | X | Δ | — |
| P2:IT-4F | Δ | O | X | Δ | X | Δ | — |

Where, X: fair, Δ: good, and O: very good.

TABLE 2

| Polymer | Solution 2$_{nm}$ [nm] | g$^{e)}$ [M$^{-1}$cm$^{-1}$] | E$_g^{opt\,d)}$ [eV] | T$_g$ [° C.] | T$_d^{e)}$ [° C.] | HOMO$^{r)}$ [eV] | LUMO$^{z)}$ [eV] |
| --- | --- | --- | --- | --- | --- | --- | --- |
| P1 | 581, 623 | 4.3 × 10$^4$ | 1.81 | — | 415 | −5.34 | −3.53 |
| P2 | 578, 617 | 5.5 × 10$^4$ | 1.84 | — | 414 | −5.50 | −3.66 |

1) Dissolution Evaluation

In order to evaluate the solubility of each of P1 and P2 synthesized according to the Examples in the organic solvents, the solubility thereof in various solvents was measured.

As shown in Table 1, it was found that P1 and P2 exhibited excellent solubility in not only general organic solvents but also non-halogen solvents.

Further, in order to identify the solubility in toluene as a non-halogen solvent, the results of the solubility measured at room temperature are shown in Table 1. As a result, P2 in the toluene solvent exhibited a relatively higher solubility than P1 exhibited.

transition thereof did not appear until 200° C. Thus, it may be identified that P1 and P2 are thermally very stable.

4) Evaluation of Electrochemical Properties

We measures the CV of P1 and P2 synthesized according to the Examples. The results are shown in FIG. 2D. Further, based on FIG. 2D, the HOMO energy levels of P1 and P2 were calculated and shown in the Table 2.

Referring to Table 2, P1 represents the HOMO energy level was −5.34 eV and that of P2 was −5.50 eV. It may be seen that the HOMO energy level of P1 is lower than that of P1 due to the strong electron pulling force by the chlorine atom as the chlorine (Cl) atom is introduced into the polymer structure of P2.

In one example, the LUMO energy levels of P1 and P2 were calculated based on differences from the band gaps calculated from the UV absorption spectrum. The LUMO energy of P1 was −3.53 eV, and that of P2 was −3.66 eV. That is, it may be identified that the LUMO energy level value of P2 is lower than that of P1 due to the strong electron pulling force by the chlorine atom.

5) Measurement of UV Absorption Spectrum of Polymer, NFA and Photo-Active Layer

The absorption spectra of P1 and P2 synthesized according to Examples, the active layer with the binary junction structure (P1:IT-4F, P2:IT-4F) using P1 and P2, and the active layer with the ternary junction structure (P1:IT-4F:BTP-4F, P1:IT-4F:BTP-4Cl, P2:IT-4F:BTP-4F, P2:IT-4F:BTP-4Cl) were measured and shown in FIG. 2E to FIG. 2G.

As shown in FIG. 2E to FIG. 2G, absorption in a wider wavelength range is exhibited in the ternary junction structure containing IT-4F and BTP-4F (or BTP-4Cl) while absorption in a narrower wavelength range is exhibited in the binary junction structure containing only IT-4F as an electron acceptor material.

Further, referring to FIG. 2G, in the ternary junction structure, the active layer containing BTP-4Cl exhibited wider and stronger light absorption than that of the active layer containing BTP-4F. This is because miscibility between BTP-4Cl and P2 is higher than that of BTP-4F and P2.

6) Measurement of Charge Mobility and Hole Mobility of Polymer and Photo-Active Layer The charge mobility and hole mobility of each of P1 and P2 synthesized according to Examples, the active layer with the binary junction structure (P1:IT-4F, P2:IT-4F) using P1 and P2, and the active layer with the ternary junction structure (P1:IT-4F:BTP-4F, P1:IT-4F:BTP-4Cl, P2:IT-4F:BTP-4F, P2:IT-4F:BTP-4Cl) were measured. The results are shown in FIG. 2H to FIG. 2K and following Table 3 to Table 4.

TABLE 3

| Active layer | $\mu_h$ (cm$^2$ V$^{-1}$ S$^{-1}$) | $\mu_e$ (cm$^2$ V$^{-1}$ S$^{-1}$) |
|---|---|---|
| P1 | $4.56 \times 10^{-2}$ | — |
| P1:IT-4F | $3.27 \times 10^{-2}$ | $3.44 \times 10^{-3}$ |
| P1:IT-4F:BTP-4Cl | $3.61 \times 10^{-2}$ | $3.17 \times 10^{-3}$ |
| P1:IT-4F:BTP-4F | $1.85 \times 10^{-2}$ | $1.75 \times 10^{-4}$ |

TABLE 4

| Active layer | $\mu_h$ (cm$^2$ V$^{-1}$ S$^{-1}$) | $\mu_e$ (cm$^2$ V$^{-1}$ S$^{-1}$) |
|---|---|---|
| P2 | $5.62 \times 10^{-2}$ | — |
| P2:IT-4F | $3.60 \times 10^{-2}$ | $2.99 \times 10^{-2}$ |
| P2:IT-4F:BTP-4F | $3.18 \times 10^{-2}$ | $2.90 \times 10^{-2}$ |
| P2:IT-4F:BTP-4Cl | $4.24 \times 10^{-2}$ | $4.02 \times 10^{-2}$ |

Referring to Tables 3 and 4, it may be seen that electron mobility is increased in the binary and ternary junction structures of the photo-active layer using P2 into which the chlorine atom is introduced, compared to that in the binary and ternary junction structures of the photo-active layer using P1. This shows that P2 has higher planarity and crystallinity than P1 has. That is, P2 represents a heavy-atom effect due to the chlorine atom. Due to the high planarity, the photo-active layer using P2 exhibits high electron mobility compared to the photo-active layer using P1 because the P2 is well aggregated with the non-fullerene-based material.

Further, as shown in Table 4, the ternary junction structure using P2 exhibited higher electron mobility and hole mobility compared to the binary junction structure and exhibits a high balance of charges mobility.

7) Measurement of Emission Spectrum of the Photo-Active Layer

Emission spectrum of each of P1 and P2 synthesized according to Examples, the active layer with the binary junction structure (P1:IT-4F, P2:IT-4F) using P1 and P2, and the active layer with the ternary junction structure (P1:IT-4F:BTP-4F, P1:IT-4F:BTP-4Cl, P2:IT-4F:BTP-4F, P2:IT-4F:BTP-4Cl) were measured. The results are shown in FIG. 2L to FIG. 2O.

As shown in FIG. 2L to 2O, it is identified that photoluminescence quenching occurs when P1 and P2 synthesized according to the Examples are properly mixed with non-fullerene-based material (NFA). This is because binary and ternary junction based bulk-hetero junctions are well formed between P1 or P2 and non-fullerene-based materials (NFAs), thereby improving dissociation of excitons.

FIG. 3 shows the energy level diagram of specific P1, P2 and NFA.

Manufacturing of Organic Solar Cell

An organic solar cell device having each of the binary and ternary bulk-hetero junction structures was manufactured using each of P1 and P2 synthesized according to the Examples as an electron donor material of the photo-active layer, and using IT-4F, BTP-4F and BTP-4Cl as a non-fullerene-based electron acceptor material of the photo-active layer. The specific manufacturing method is as follows.

[Manufacturing Example 1]
ITO/ZnO/P1:IT-4F/MoO$_3$/Ag

Specifically, a ITO (Indium tin oxide)-coated glass substrate was ultrasonically washed with distilled water, a detergent, acetone, and isopropanol to remove impurities.

Next, UV—O$_3$ treatment was performed for 15 minutes to remove residual solvent and to cause the surface to be hydrophilic. Then, zinc oxide (ZnO) (filtered at 0.45 μm) was spin-coated on the pretreated ITO-coated glass substrate and heat-treated at 180° C. for 30 minutes to form an electron transport layer (20 nm).

P1 and IT-4F were put in toluene and dissolved therein overnight. After spin coating the solution on the electron transport layer, heat treatment thereof was performed at 100° C. for 10 minutes to form a photo-active layer having a binary junction structure.

Thereafter, $MoO_3$ was deposited to a 10 nm thickness on the layer using a shadow mask in a $10^{-7}$ Torr vacuum chamber. We deposited an Ag electrode to a thickness of 100 nm the $MoO_3$ layer. Thus, an organic solar cell device having an ITO/ZnO/P1:IT-4F/$MoO_3$/Ag structure was fabricated.

[Manufacturing Example 2]
ITO/ZnO/P1:IT-4F:BTP-4F/$MoO_3$/Ag

P1, IT-4F and BTP-4F were added to toluene and dissolved therein overnight. Except for forming the photo-active layer with a ternary junction structure by spin coating the solution on the hole transport layer and heat treatment thereof at 120° C. for 10 minutes, an organic solar cell device was manufactured in the same manner as in Manufacturing Example 1.

[Manufacturing Example 3]
ITO/ZnO/P1:IT-4F:BTP-4Cl/$MoO_3$/Ag

An organic solar cell device was fabricated in the same manner as in Manufacturing Example 2, except for containing BTP-4Cl instead of BTP-4F as the material of the photo-active layer.

[Manufacturing Example 4]
ITO/ZnO/P2:IT-4F/$MoO_3$/Ag

An organic solar cell device was manufactured in the same manner as in Manufacturing Example 1, except that P2 was included instead of P1 as the material of the photo-active layer.

[Manufacturing Example 5]
ITO/ZnO/P2:IT-4F:BTP-4F/$MoO_3$/Ag

An organic solar cell device was manufactured in the same manner as in Manufacturing Example 2, except that P2 was included instead of P1 as the material of the photo-active layer.

[Manufacturing Example 6]
ITO/ZnO/P2:IT-4F:BTP-4CL/$MoO_3$/Ag

An organic solar cell device was manufactured in the same manner as in Manufacturing Example 3, except that P2 was included instead of P1 as the material of the photo-active layer.

Characteristics of Organic Solar Cell Device

We measures photoelectric power characteristics, current density-voltage (J-V) characteristics, and external quantum efficiency (EQE) values of the organic solar cell devices prepared according to Preparation Examples 1 to 6. The results are shown in FIG. 4A-FIG. 4B and FIG. 5A to FIG. 5B.

Further, we measured the open-circuit voltage (Voc), short-circuit current density (Jsc), fill factor (FF), and power conversion efficiency (PCE) of each of the organic solar cell devices according to the Preparation Examples. The measurement results are shown in Tables 5 and 6 below.

TABLE 5

| Active layer | Additive | Annealing | $V_{OC}$ (V) | $J_{SC}$ (mA/cm$^2$) | $J_{SC}$ (EQE) (mA/cm$^2$) | FF (%) | PCE (%) |
| --- | --- | --- | --- | --- | --- | --- | --- |
| P1:IT-4F:BTP-4CL | DPE-0.5% | 120° C. for 10 min | 0.68 | 19.42 | 17.54 | 55.56 | 7.58 |
| P1:IT-4F:BTP-4F | DPE-0.5% | 120° C. for 10 min | 0.73 | 16.47 | — | 52.33 | 6.37 |
| P1:IT-4F | DPE-0.5% | 100° C. for 10 min | 0.67 | 16.78 | 14.02 | 48.98 | 5.58 |

TABLE 6

| Active layer | Additive | Annealing | $V_{OC}$ (V) | $J_{SC}$ (mA/cm$^2$) | $J_{SC}$ (EQE) (mA/cm$^2$) | FF (%) | PCE (%) |
| --- | --- | --- | --- | --- | --- | --- | --- |
| P2:IT-4F:BTP-4CL | DPE-0.5% | 120° C. for 15 min | 0.87 | 21.98 | 20.02 | 70.03 | 13.25 |
| P2:IT-4F:BTP-4F | DPE-0.5% | 120° C. for 15 min | 0.85 | 17.96 | 17.98 | 71.60 | 11.02 |
| P2:IT-4F | DPE-0.5% | 100° C. for 10 min | 0.84 | 17.43 | 16.03 | 69.78 | 10.38 |

Referring to Tables 5 and 6, it may be identified that both organic solar cells prepared using P1 and P2 exhibit the maximum PCE (%) value in the ternary junction structure using IT-4F:BTP-4Cl. This is due to absorption in a wide wavelength range in the ternary junction structure.

Further, the organic solar cell using P1 exhibited relatively low PCE (%) value compared to the organic solar cell using P2. This is because P2 into which chlorine is introduced has a high absorption coefficient, as shown in FIG. 1A.

In one example, it should be noted that when comparing FIG. 4B and FIG. 5B showing external quantum efficiencies with each other, the external quantum efficiency (EQE) of a solar cell with a P2:IT-4F:BTP-4Cl structure exhibits a wider range than the external quantum efficiency (EQE) of a solar cell with a P1:IT-4F:BTP-4Cl structure does.

That is, among Examples according to the present disclosure, a solar cell having a photo-active layer having a P2:IT-4F:BTP-4Cl ternary junction structure may exhibit the highest efficiency.

Efficiency Evaluation of Organic Solar Cell Based on Thickness of Photo-Active Layer In one example, in order to identify the possibility of application of the organic solar cell including the photo-active layer with the ternary junction structure to a large area process, the efficiency of organic solar cells was measured while forming a photo-active layer with a ternary junction structure in various thicknesses.

Specifically, we measured the open-circuit voltage (Voc), short-circuit current density (Jsc), fill factor (FF), and power conversion efficiency (PCE) of the organic solar cell device based on the thickness of the photo-active layer. The measurement results are shown in Tables 7 and 8.

TABLE 7

| Thickness (nm) | Voc (V) | Jsc (mA/cm$^2$) | FF (%) | PCE (%) |
| --- | --- | --- | --- | --- |
| 130 | 0.73 ± 0.03 | 16.61 ± 0.41 | 39.28 ± 2.0 | 4.27 ± 0.21 |
| 150 | 0.71 ± 0.02 | 17.26 ± 0.13 | 44.40 ± 3.0 | 5.46 ± 0.12 |
| 200 | 0.68 ± 0.02 | 19.12 ± 0.41 | 55.56 ± 2.0 | 7.58 ± 0.44 |
| 240 | 0.71 ± 0.01 | 15.51 ± 0.12 | 44.41 ± 1.0 | 4.90 ± 0.33 |
| 280 | 0.73 ± 0.02 | 12.74 ± 0.23 | 38.27 ± 2.0 | 3.60 ± 0.21 |
| 300 | 0.74 ± 0.03 | 8.87 ± 0.31 | 35.26 ± 3.0 | 2.35 ± 0.14 |

TABLE 8

| Thickness (nm) | Voc (V) | Jsc (mA/cm$^2$) | FF (%) | PCE (%) |
| --- | --- | --- | --- | --- |
| 120 | 0.88 ± 0.02 | 16.91 ± 0.22 | 65.44 ± 2.0 | 9.77 ± 0.33 |
| 160 | 0.85 ± 0.01 | 17.18 ± 0.24 | 67.50 ± 1.0 | 10.01 ± 0.47 |
| 220 | 0.86 ± 0.03 | 21.57 ± 0.46 | 69.40 ± 4.0 | 12.87 ± 0.69 |
| 300 | 0.87 ± 0.01 | 21.98 ± 0.37 | 70.03 ± 3.0 | 13.25 ± 0.27 |
| 350 | 0.86 ± 0.02 | 21.57 ± 0.18 | 70.05 ± 2.0 | 13.01 ± 0.39 |
| 400 | 0.83 ± 0.04 | 21.82 ± 0.19 | 64.63 ± 1.0 | 11.81 ± 0.21 |
| 450 | 0.81 ± 0.03 | 18.71 ± 0.36 | 62.83 ± 4.0 | 9.62 ± 0.33 |
| 500 | 0.84 ± 0.01 | 14.75 ± 0.37 | 60.05 ± 2.0 | 7.51 ± 0.40 |

As shown in Table 7, when the thickness of the photo-active layer of the organic solar cell using P1 was smaller than 200 nm, and as the thickness increased, the PCE (%) value increased. However, when the thickness was above 200 nm, the PCE (%) value tended to decrease rapidly as the thickness increased. This is because, as shown in the charge mobility values in Table 2, as the thickness increases while being above 200 nm, recombination of electrons and holes in the active layer increases due to imbalance in movement of electrons and holes, and thus charge extraction may be difficult.

On the other hand, referring to Table 8, in the organic solar cell using P2, a maximum PCE (%) value of 13% or greater was exhibited at 300 nm of the thickness. It may be seen that the PCE (%) value when using P2 is significantly higher than that when using P1. This is because P2 has high electron and hole mobility, and the high planarity, and thus aggregation of P2 with the non-fullerene-based electron acceptor material (NFA) is well established, and Thus, the internal charge transfer is improved.

Surface Roughness Measurement of Photo-Active Layer

A surface roughness of the photo-active layer with a ternary junction structure was measured using an atomic force microscope (AFM) and shown in FIG. 6.

As shown in FIG. 6, the surface roughness of the photo-active layer with the P2:IT-4F:BTP-4Cl ternary junction structure is 0.76 nm, which is the lowest among those of the Examples.

Lifespan Measurement of Organic Solar Cell

The lifespan of the organic solar cell fabricated using the photo-active layer containing P2 was measured under constant temperature and constant humidity, and nitrogen environment, respectively. In this connection, encapsulation was not performed.

Further, in order to identify the thermal stability, PCE was measured in a nitrogen environment, and at a temperature of 120° C. The results are shown in FIG. 7A and FIG. 7B.

Referring to FIG. 7B, it was identified that in the organic solar cell according to the Example, only about 25% reduction in efficiency after 24 hours even occurred at a high temperature of 120° C. Further, the PCE value of the organic solar cell did not change significantly even under constant temperature and constant humidity and nitrogen environment.

This is because the photo-active layer according to the Example of the present disclosure has a large contact angle of 1040 or greater, as shown in a contact angle result shown in FIG. 8, and, thus, the surface thereof has hydrophobic properties, thereby to prevent moisture and oxygen from penetrating into the layer through the surface thereof.

As described above, the present disclosure is described with reference to the drawings. However, the present disclosure is not limited to the embodiments and drawings disclosed in the present specification. It will be apparent that various modifications may be made thereto by those skilled in the art within the scope of the present disclosure. Furthermore, although the effect resulting from the features of the present disclosure has not been explicitly described in the description of the embodiments of the present disclosure, it is obvious that a predictable effect resulting from the features of the present disclosure should be recognized.

What is claimed is:

1. An active layer composition for a solar cell, the active layer composition comprising:
    5000 to 50000 parts by weight of an organic solvent;
    10 to 300 parts by weight of an electron acceptor material, based on 100 parts by weight of a two-dimensional conjugated polymer; and
    the two-dimensional conjugated polymer containing a repeating unit represented by a following Chemical Formula 2 as an electron donor material:

[Chemical Formula 2]

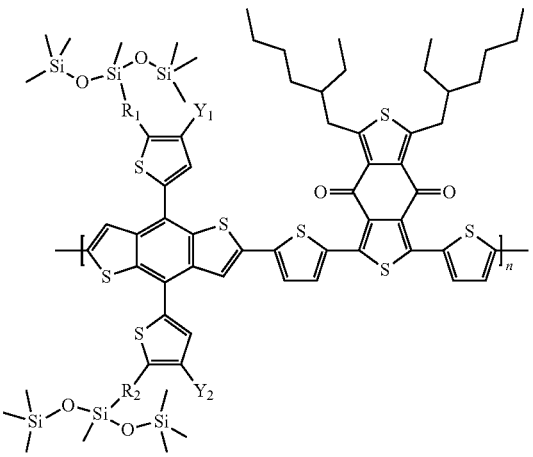

wherein in the Chemical Formula 2, each of $Y_1$ and $Y_2$ are Cl;

wherein each of $R_1$ and $R_2$ independently represents a substituted or unsubstituted alkylene having 9 to 30 carbon atoms;

wherein n is an integer of 5 to 2000; and wherein the active layer has a ternary junction with the electron donor material and at least two types of non-fullerene-based electron acceptor materials mixed with each other, wherein the two types of non-fullerene-based electron acceptor materials are selected from IT-4F and BTP-4F, or IT-4F and BTP-4Cl.

2. The active layer composition of claim 1, wherein the two-dimensional conjugated polymer contains a repeating unit represented by a following Chemical Formula 3:

[Chemical Formula 3]

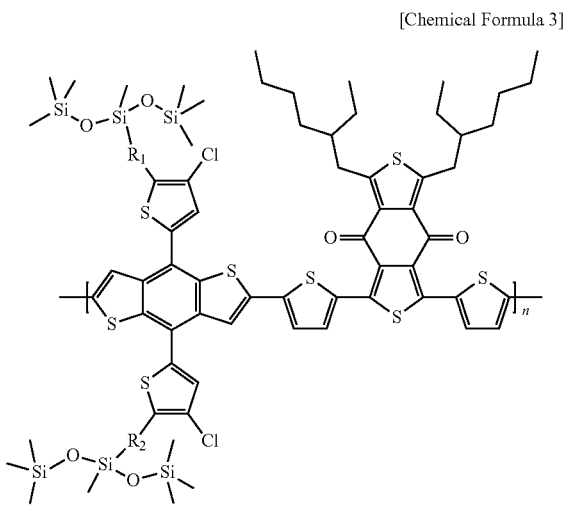

wherein in the Chemical Formula 3, each of $R_1$ and $R_2$ independently represents substituted or unsubstituted alkyl having 9 to 30 carbon atoms, cycloalkyl having 9 to 20 carbon atoms, alkylthio having 9 to 30 carbon atoms, aryl having 9 to 20 carbon atoms, aryl having 6 to 20 carbon atoms substituted with alkyl having 3 to 24 carbon atoms, alkyl having 3 to 24 carbon atoms substituted with aryl having 6 to 20 carbon atoms, or heteroaryl having 9 to 20 carbon atoms;

wherein the heteroaryl contains at least one heteroatom selected from N, O, S and Se;

wherein n is an integer of 5 to 2000.

3. The active layer composition of claim 1, wherein a highest occupied molecule orbital (HOMO) energy level of the two-dimensional conjugated polymer is in a range of −5.6 to −5.3 eV, and a lowest un-occupied molecular orbital (LUMO) energy level thereof is in a range of −3.7 to −3.5 eV.

4. The active layer composition of claim 1, wherein a charge mobility of the two-dimensional conjugated polymer is in a range of $4.5 \times 10^{-2}$ to $5.7 \times 10^{-2}$ $cm^2 V^{-1} S^{-1}$.

5. The active layer composition of claim 1, wherein the active layer composition contains 10 parts by weight of the electron acceptor material.

6. The active layer composition of claim 5, wherein the organic solvent includes a non-halogen solvent.

7. The active layer composition of claim 6, wherein the non-halogen solvent includes at least one selected from a group consisting of dimethyl acetamide (DMAC), dimethyl sulfoxide (DMSO), toluene and alcohol.

8. An organic solar cell comprising:

a substrate;

a first electrode disposed on the substrate;

a photo-active layer disposed on the first electrode and containing the active layer composition for the solar cell according to claim 1; and a second electrode disposed on the photo-active layer;

wherein the photo-active layer has a bulk ternary junction in which one type of an electron donor material and at least one type of a non-fullerene-based electron acceptor material are mixed with each other;

wherein the photo-active layer has the bulk ternary junction structure in which one of the electron donor materials containing a repeating units is Chemical Formula 2, and is mixed with two types of the non-fullerene-based electron acceptor materials, wherein when a thickness of the photo-active layer is 450 nm or smaller, a power conversion efficiency (PCE) value (%) of the organic solar cell is 9.3% or greater, and a fill factor (FF) value (%) is 62.3% or greater;

wherein the two types of non-fullerene-based electron acceptor materials are a combination of IT-4F and BTP-4F or IT-4F and BTP-4Cl;

wherein in the Chemical Formula 4-2, n is an integer of 5 to 2000.

* * * * *